United States Patent [19]

Kashihara et al.

[11] Patent Number: 5,382,817
[45] Date of Patent: Jan. 17, 1995

[54] SEMICONDUCTOR DEVICE HAVING A FERROELECTRIC CAPACITOR WITH A PLANARIZED LOWER ELECTRODE

[75] Inventors: Keiichiro Kashihara; Hiromi Itoh, both of Hyogo, Japan

[73] Assignee: Mitsubishi Denki Kabushiki Kaisha, Tokyo, Japan

[21] Appl. No.: 20,082

[22] Filed: Feb. 19, 1993

[30] Foreign Application Priority Data

Feb. 20, 1992 [JP] Japan ................................. 4-033577
Jan. 18, 1993 [JP] Japan ................................. 5-006061

[51] Int. Cl.⁶ ............................................... H01L 29/92
[52] U.S. Cl. ................................. 257/295; 257/752; 257/763; 257/915
[58] Field of Search ................. 257/295, 752, 763, 915

[56] References Cited

U.S. PATENT DOCUMENTS

| 5,005,102 | 4/1991 | Larson | 361/313 |
| 5,046,043 | 9/1991 | Miller et al. | 257/298 |

FOREIGN PATENT DOCUMENTS

| 1-321614 | 12/1989 | Japan | |
| 2-83978 | 3/1990 | Japan | 257/763 |
| 3-87056 | 4/1991 | Japan | |
| 3-101260 | 4/1991 | Japan | |
| 3-256358 | 11/1991 | Japan | 257/295 |

OTHER PUBLICATIONS

"Barrier layers for realization of high capacitance density in SrTiO thin-film capacitor or silicon", by Toshiyuki Sakuma et al., Appl. Phys. Lett., vol. 57, No. 23, Dec. 3, 1990, pp. 2431-2433.

Primary Examiner—Robert Limanek
Attorney, Agent, or Firm—Lowe, Price, Leblanc & Becker

[57] ABSTRACT

A semiconductor device capable of improving pressure-resistant and leakage-resistant characteristics of a stacked type capacitor formed on a planarized insulating layer. The semiconductor device includes a plug electrode layer 313 of at least one material selected from the group consisting of TiN, Ti, W, and WN, buried in a contact hole 311a of an interlayer insulating films 311 and extending on and along the upper surface of interlayer insulating film 311. As a result, creation of a stepped portion on platinum layer 314 constituting a capacitor lower electrode to be formed on the plug electrode 313 is prevented, and the thickness of a PZT film 315 to be formed on platinum layer 314 is not disadvantageously made thin at the stepped portion. Therefore, the space between a capacitor upper electrode 316 and platinum layer 314 constituting the capacitor lower electrode can not be made narrow, and an electric field between platinum layer 314 and capacitor upper electrode 316 is made uniform, enhancing pressure-resistant and leakage-resistant characteristics. Also, a silicification reaction of platinum layer 314 is prevented due to plug electrode layer 313. In addition, when plug electrode layer 313 is formed of Ti or TiN, adhesion of plug electrode layer 313 and interlayer insulating film 311 is improved, and thus separation of platinum layer 314 is prevented.

8 Claims, 47 Drawing Sheets

SEMICONDUCTOR DEVICE HAVING A FERROELECTRIC CAPACITOR WITH A PLANARIZED LOWER ELECTRODE

BACKGROUND OF THE INVENTION

1. Field of the Invention

The present invention relates to a semiconductor device and a manufacturing method of the same, and particularly to a structure of a dynamic random access memory (DRAM) and a manufacturing method of the same.

2. Description of the Related Art

In recent years, demand for semiconductor memory devices has rapidly increased owing to remarkably widened use of information equipments such as computers. Further, with respect to functions, there have been demanded semiconductor memory devices having large storage capacities and capable of high-speed operations. In compliance with this, technical development for high integration, high responsibility and high reliability of the semiconductor memory devices has been advanced.

DRAMs (dynamic random access memories) are known as the semiconductor memory devices which allow random input and output of stored information. Generally, the DRAM is formed of a memory cell array part which is a memory region storing a large amount of information, and a peripheral circuit part which is necessary for external input and output.

FIG. 61 is a block diagram showing a general structure of a DRAM. Referring to FIG. 61, a DRAM 150 includes a memory cell array 151, a row and column address buffer 152 for externally receiving an address signal which is used for selecting a memory cell forming a unit memory circuit, row and column decoders 153 and 154 which decode the address signal to designate a memory cell, a sense refresh amplifier 155 which amplifies the signal stored in the designated memory cell to read the same, data-in and data-out buffers 156 and 157 for input and output of the data, and a clock generator 158 for generating a clock signal.

Memory cell array 151, which occupies a large area on a semiconductor chip, is formed of a plurality of memory cells each storing unit memory information disposed in a matrix. Each memory cell is generally formed of one MOS transistor and one capacitor connected thereto. This memory cell is well known as a memory cell of one-transistor/one-capacitor type. The memory cells having such simple structures enable the highly integrated memory cell array without difficulty, so that they are widely used in the DRAMs of large capacities.

The memory cells of the DRAMs can be classified into several types depending on the structures of the capacitors. Among them, in a stacked type capacitor an opposed area between electrodes of the capacitor is increased by extending a major part of the capacitor to a position above a gate electrode and a field isolation film. The opposed area thus increased between the electrodes of the capacitor increases the capacity of the capacitor. Since the stacked type capacitor has such feature, the capacitor capacity can be ensured even if elements are miniaturized in accordance with the high integration of the semiconductor device. Consequently, the stacked type capacitors have come to be widely used accordance with the higher integration of the semiconductor devices.

FIG. 62 is a cross section showing a DRAM provided with a conventional stacked type capacitor. Referring to FIG. 62, the conventional DRAM includes a semiconductor substrate 101 as well as following components and portions. An isolating oxide film 102 for elements is formed on a predetermined region of a major surface of semiconductor substrate 101. A channel stopper layer 103 is formed under isolating oxide film 102. A pair of source/drain regions 104 and 105 are formed in a region surrounded by an isolating oxide film 102 with a channel region 106 therebetween. A gate electrode 108 is formed on channel region 106 with a gate insulating film 107 therebetween. Gate electrode 108 is covered with an interlayer insulating film 109, which is covered with an interlayer insulating film 110. A capacitor lower electrode 111 formed of polysilicon is electrically connected to source/drain region 105 and extends on and along interlayer insulating film 110. Capacitor lower electrode 111 is covered with a capacitor insulating film 112, on which a capacitor upper electrode 113 is formed. An interlayer insulating film 114 covers the whole surface and has a contact hole 114a located on source/drain region 104. A polysilicon layer 115 is electrically connected to source/drain region 104 and extends on and along a surface of an interlayer insulating film 114. A tungsten silicide layer 116 is formed on polysilicon layer 115, and is covered with an interlayer insulating film 117. An interconnection layer 118 is formed on an interlayer insulating film 117 to correspond to gate electrode 108.

Interconnection layer 118 is formed of a titanium layer 118a and an aluminum alloy layer 118b formed on titanium layer 118a. Capacitor lower electrode 111, capacitor insulating film 112 and capacitor upper electrode 113 form a capacitor for storing electric charges corresponding to a data signal. Polysilicon layer 115 and tungsten silicide layer 116 form a signal transmitting line, i.e., a bit line. Source/drain regions 104 and 105 and gate electrode 108 form a transfer gate transistor.

In a reading operation, the charges corresponding to the data signals are transmitted through a bit line (115 and 116) to source/drain region 104. By applying a predetermined voltage to gate electrode 108, the transfer gate transistor is turned on. Upon turn-on of the transfer gate transistor, the charges stored in source/drain region 104 are transmitted through channel region 106 to source/drain region 105. The charges transmitted to source/drain region 105 are stored in the capacitor (111, 112 and 113).

In the reading operation, a predetermined voltage is applied to gate electrode 108 to turn on the transfer gate transistor. Thereby, the charges stored in the capacitor (111, 112 and 113) are transmitted through capacitor lower electrode 111, source/drain region 105 and source/drain region 104 to bit line (115 and 116).

FIGS. 63–82 are cross sections showing a manufacturing process (lst to 20th steps) of the conventional DRAM shown in FIG. 62. The manufacturing process of the conventional DRAM will be described below with reference to FIG. 62 as well as FIGS. 63–82.

First, as shown in FIG. 63, an underlayer oxide film 102a is formed on P-type silicon semiconductor substrate 101. A silicon nitride film 119 is formed on underlayer oxide film 102a.

Then, as shown in FIG. 64, resist 120 is formed on a predetermined region of a silicon nitride film 119, using photolithography. Anisotropic etching is then applied, using resist 120 as a mask, for patterning silicon nitride film 119. Impurities are ion-implanted, using patterned silicon nitride film 119 and resist 120 as a mask.

Then, as shown in FIG. 65, thermal oxidation is applied, using silicon nitride film 119 as a mask, to form isolating oxide film (field oxide film) 102 and channel stopper layer 103. Thereafter, silicon nitride film 119 is removed.

Then, as shown in FIG. 66, impurities for channel doping are ion-implanted, and thereafter, underlayer oxide film 102a is removed.

Then, as shown in FIG. 67, a gate oxide film layer 107a is formed, using thermal oxidation. Impurity doped polysilicon layer 108a is formed by a CVD method or the like. Oxide film 109a is formed on gate electrode layer 108a.

Then, as shown in FIG. 68, a resist 121 is formed on a predetermined region of oxide film 109a, using photolithography. Anisotropic etching is applied, using resist 121 as a mask, to form gate electrode 108 and oxide film 109a.

Then, as shown in FIG. 69, impurities are ion-implanted, using gate electrode 108 and oxide film 109a as a mask, whereby source/drain regions 104 and 105 are formed in a self-aligned manner.

Then, as shown in FIG. 70, oxide film 109b is formed over the whole surface, using the CVD method or the like.

Then, as shown in FIG. 71, anisotropic etching is applied to the whole surface, and side walls 109b are formed in the self-aligned manner on opposite side walls of gate electrodes 108. Thereby, gate electrode 108 is covered in the self-aligned manner with insulating film 109 (109a and 109b).

Then, as shown in FIG. 72, oxide film 110 is further formed on the whole surface.

Then, as shown in FIG. 73, a resist 122 is formed on a portion of oxide film 110 except for a region located above source/drain region 105. Etching is done using resist 122 as a mask, to form a contact hole 110a through which source/drain region 105 is exposed. Impurities are ion-implanted, using contact hole 110a and resist 122 as a mask. Thereafter, resist 122 is removed.

Then, as shown in FIG. 74, a capacitor lower electrode layer 111a of polysilicon is formed on the whole surface. Impurities are ion-implanted into capacitor lower electrode layer 111a formed of polysilicon to render the same conductive.

Then, as shown in FIG. 75, a resist 123 is formed on a predetermined region of capacitor lower electrode layer 111a (see FIG. 74), using the photolithography. Anisotropic etching is done, using resist 123 as a mask, to form capacitor lower electrode 111. Thereafter, resist 123 is removed.

Then, as shown in FIG. 76, a capacitor insulating film 112a is formed on the whole surface, and thereafter, a capacitor upper electrode layer 113a of polysilicon containing doped impurity is formed on capacitor insulating film 112a.

Then, as shown in FIG. 77, a resist 124 is formed on a predetermined region of capacitor upper electrode layer 113a (see FIG. 76), using photolithography. Anisotropic etching is done, using resist 124 as a mask, to form capacitor insulating film 112 and capacitor upper electrode 113. Thereafter, resist 124 is removed.

Then, as shown in FIG. 78, interlayer insulating film 114 is formed on the whole surface. Reflow method or etch-back method is applied to planarized an upper surface of interlayer insulating film 114.

Then, as shown in FIG. 79, a resist 125 is formed on a predetermined region of interlayer insulating film 114, using photolithography. Anisotropic etching is done, using resist 125 as a mask, to form contact hole 114a, and then isotropic etching is done to form a contact hole 114b. Thereby, the surface of source/drain region 104 is exposed. Thereafter, resist 125 is removed.

Then, as shown in FIG. 80, CVD method is used to form polysilicon layer 115 on the whole surface. A sputter method is used to form tungsten silicide (WSi$_2$) layer 116 on polysilicon layer 115. Polysilicon layer 115 and tungsten silicide layer 116 are patterned, using the photolithography, to form the bit line by polysilicon layer 115 and tungsten silicide 116.

Then, as shown in FIG. 81, interlayer insulating film 117 is formed to cover tungsten silicide layer 116. After forming titanium layer 118a on interlayer insulating film 117, using sputter method, aluminum alloy layer 118b is formed, using the sputter method.

Then, as shown in FIG. 82, a resist 126 is formed on a predetermined region of aluminum alloy layer 118b, using photolithography. Anisotropic etching is done, using the resist 126 as a mask, to form interconnection layer consisting of titanium layer 118a and aluminum alloy layer 118b. Thereafter, resist 126 is removed. Thereby, the DRAM as shown in FIG. 62 is formed.

As described above, the stacked capacitor as shown in FIG. 62 has been used in the prior art in order to ensure an intended capacitor capacity even in a case that the elements are miniaturized in accordance with the high integration of the semiconductor device.

However, it is difficult to ensure the intended capacitor capacity in the structure as shown in FIG. 62, e.g., in the DRAM of 256 Mbit, in which elements are further miniaturized.

An improvement such as described in the following has been proposed. FIG. 83 is a cross section showing a DRAM provided with an improved stacked type capacitor in the prior art. Referring to FIG. 83, the improved prior art DRAM includes a silicon semiconductor substrate 131 as well as the following components and portions. An isolating oxide film 132 for isolating elements is formed on a predetermined region of a major surface of silicon semiconductor substrate 131. A channel stopper layer 133 is formed under isolating oxide film 132. Source/drain regions 134 and 135 are formed in a region surrounded by isolating oxide film 132 and are located at opposite sides of a channel region 136 with a predetermined space therebetween. A gate electrode 138 is formed on channel region 136 with a gate insulating film 137 therebetween. Gate electrode 138 is covered with an insulating film 139. A buried bit line 140 is electrically connected to source/drain region 134 and extends on and along a surface of insulating film 139. An interlayer insulating film 141 covers the whole surface and has a contact hole 141a located above source/drain region 135. A polysilicon plug 142 is formed in contact hole 141a and is electrically connected to source/drain region 135. A platinum layer 143 extends on polysilicon plug 142 and interlayer insulating film 141. A ferroelectric film 144 containing lead such as PZT (zirconium lead titanate ceramics) or PLZT is formed on platinum layer 143. A capacitor upper electrode 145 of, e.g., platinum is formed on ferroelectric film 144. An interlayer insulating film 146 is formed to cover the whole surface and has a contact hole 146a located above capacitor upper electrode 145. An interconnection layer 147 extends on and along interlayer insulating film 146 and is electrically connected to capacitor electrode 145. Ferroelectric film 144 forms a capacitor insulating film.

FIGS. 84 to 88 are cross sectional views showing a manufacturing process of a conventional DRAM shown in FIG. 83. Referring to FIG. 83 and FIGS. 84 to 88, a manufacturing process will be described. First, as shown in FIG. 84, isolating oxide film 132 is formed on a predetermined region of a major surface of silicon semiconductor substrate 131. Channel stopper layer 133 is formed under isolating oxide film 132. Source-drain regions 134 and 135 are formed on an activated region of silicon semiconductor substrate 131, apart from each other with a predetermined space. Gate electrode 138 is formed between source-drain regions 134 and 135 on silicon semiconductor substrate 131 with gate insulating film 137 interposed therebetween. Insulating film 139 is formed to cover gate electrode 138. Buried bit line 140 is formed electrically connected to source/drain region 134 and extending on and along a surface of insulating film 139. After interlayer insulating 141 is formed, having its surface planarized so as to cover the whole surface, contact hole 141a is formed thereon reaching source/drain region 135.

A polysilicon layer 142a is formed in contact hole 141a and on an upper surface of interlayer insulating film 141 by means of the CVD method. Thereafter, polysilicon layer 142a located on the upper surface of interlayer insulating film 141 is etched back to be removed, and is further overetched for the purpose of completely removing residues caused by the etching on the upper surface of interlayer insulating film 141. Polysilicon plug 142 in a shape shown in FIG. 86 is thus obtained.

As shown in FIG. 87, a platinum layer 143a is formed on the upper surface of interlayer insulating film 141 and on a surface of silicon plug 142 in contact hole 141a utilizing the sputter method. Thereafter, as shown in FIG. 88, a ferroelectric film layer 144a of PZT or PLZT or the like is formed on platinum layer 143a by means of the sputter method, and a capacitor upper electrode layer 145a is formed thereon. Platinum layer 143a, ferroelectric film layer 144a and capacitor upper electrode layer 145a are patterned, and an interlayer insulating film 146 and an interconnection layer 147 are formed. The conventional DRAM shown in FIG. 83 can thus be obtained.

As described above, there has been proposed a DRAM in which bit line 140 is buried and the capacitor insulating film is formed of ferroelectric film 144 having a high dielectric constant in order to ensure a sufficient capacitor capacity even in a case that the elements are further miniaturized.

In this proposed DRAM, however, the following problem arises. That is, in the etching back process of polysilicon layer 142a shown in FIGS. 85 and 86, polysilicon layer 142a is overetched for completely removing residues, caused by etching, on the upper surface of interlayer insulating film 141, whereby the upper surface of polysilicon plug 142 is formed sunken in contact hole 141a. If, on the upper surface of this condition, platinum layer 143a is formed utilizing a method which cannot cover a stepped portion sufficiently, such as the sputter method, and ferroelectric film layer 144a is further formed on platinum layer 143a utilizing the sputter method, a thin portion of ferroelectric film layer 144a will be created on the stepped portion of platinum layer 143a. In this condition, formation of capacitor upper electrode layer 145a will result in a shape as shown in FIG. 88. That is, a space between platinum layer 143a and capacitor upper electrode layer 145a in the vicinity of the stepped portion of platinum layer 143a is made narrow, causing a disadvantage that an electric field applied thereon becomes stronger than that of other portions. As a result, a problem occurs that pressure-resistant and leakage-resistant characteristics as a whole capacitor are impaired.

Adhesion between interlayer insulating film 141 and capacitor lower electrode, i.e., platinum layer 143 is insufficient, so that platinum layer 143 may be disadvantageously separated. Since interconnection layer 142 is formed of polysilicon, platinum layer 143 and interconnection layer 142 may cause a silicification reaction due to a heat treatment in a later step. The silicification reaction forms an $SiO_2$ film (not shown) having a low dielectric constant at an interface between ferroelectric film 144 and platinum layer 143. This reduces the capacitor capacity, resulting in a disadvantage that the stable operation of the memory cannot be ensured. Platinum layer 143 is essential, if ferroelectric film 144 containing the lead is used, so that the perovskite crystal structure and the high dielectric constant may be maintained.

As described above, there has been proposed a memory cell which is of the buried bit line type and uses ferroelectric film 144 to deal with the further miniaturization of the elements. The proposed memory cell, however, has various disadvantages as described above. Therefore, it is impossible to ensure a sufficient and stable capacitor capacity in the proposed prior art, if the elements are further miniaturized.

SUMMARY OF THE INVENTION

An object of the invention is to improve pressure-resistant and leakage-resistant characteristics of a capacitor in a semiconductor device.

Another object of the invention is to manufacture readily a semiconductor device with improved pressure-resistant and leakage-resistant characteristics, in a manufacturing method of a semiconductor device.

Still another object of the invention is to provide a semiconductor device, in which a capacitor capacity enough for memory storage can be ensured even in a case that elements are further miniaturized.

A further object of the invention is to provide a semiconductor device, which prevents a silicification reaction of an interconnection layer formed of polysilicon and a platinum layer (high melting point noble metal layer).

A further object of the invention is to provide a semiconductor device, which prevents separation of a platinum layer forming a capacitor lower electrode from an interlayer insulating film formed under the platinum layer in a case that a ferroelectric film formed of PZT is used as a capacitor insulating film.

A further object of the invention is to provide a manufacturing method of a semiconductor device, which effectively prevents a silicification reaction of platinum layer (high melting point noble metal layer) and a silicon layer at a later heat treatment step.

Yet another object of the invention is to provide a manufacturing method of a semiconductor device, which prevents formation of an $SiO_2$ film having a low dielectric constant at an interface between a platinum layer (high melting point noble metal layer) forming a capacitor lower electrode and a ferroelectric film.

According to one aspect of the invention, the semiconductor device includes a semiconductor substrate; an insulating layer formed on the semiconductor substrate and having its upper surface planarized with an aperture portion reaching the semiconductor substrate on a predetermined region; a plug electrode layer formed of at least one material selected from a group consisting of high melting point metals and high melting point metal nitrides, filling the aperture portion so as to contact with the semiconductor substrate therein, and extending on and along the upper surface of the insulating layer; a capacitor lower electrode formed of a high melting point noble metal layer on the plug electrode layer; a zirconium lead titanate ceramic (PZT) layer formed on the capacitor lower electrode; and a capacitor upper electrode formed on the PZT layer.

In operation, the plug electrode layer filled in the aperture portion of the insulating layer in contact with the semiconductor substrate is further formed extending on and along the upper surface of the insulating layer, whereby, when the capacitor lower electrode is formed on the plug electrode layer, a stepped portion seen in the prior art cannot be created thereon, preventing the thickness of the PZT layer formed on the capacitor lower electrode from being thin at the stepped portion. Therefore, in a case that the capacitor upper electrode is formed on the PZT layer, a narrow portion seen in the prior art is not created between the capacitor lower electrode and the capacitor upper electrode, and the pressure-resistant and leakage-resistant characteristics of the capacitor are not impaired. A silicification reaction of the capacitor lower electrode, which may occur in the prior art, can also be effectively prevented, because the plug electrode layer is formed of at least one material selected from a group consisting of high melting point metals and high melting point metal nitrides. In addition, by using as the plug electrode layer a material of good adhesion to an insulating layer of TiN or the like, adhesion of the capacitor lower electrode formed of a high melting point noble metal layer is improved, and thus separation of the capacitor lower electrode which may occur in the prior art can be prevented.

According to another aspect of the invention, the semiconductor device includes a semiconductor substrate, an insulating layer formed on the semiconductor substrate, and having its upper surface planarized with an aperture portion reaching the semiconductor substrate on a predetermined region; a plug electrode formed filling up to a predetermined height in the aperture portion as well as in contact with the semiconductor substrate therein; an adhesive layer formed of one material selected from a group consisting of high melting point metals and high melting point metal nitrides, electrically connected to the plug electrode in the aperture portion and extending on and along the upper surface of the insulating layer; a capacitor lower electrode formed of a high melting point noble metal layer on the adhesive layer; a zirconium lead titanate ceramic (PZT) layer formed on the capacitor lower electrode; and a capacitor upper electrode formed on the PZT layer.

In operation, adhesion of the capacitor lower electrode formed of a high melting point nobel metal layer is improved by the adhesive layer, because the plug electrode is formed to fill in contact with the semiconductor substrate in the aperture portion of the insulating layer and up to a predetermined height in the aperture portion; the adhesive layer is formed to electrically connect to the plug electrode and to extend on and along the upper surface of the insulating layer; and the capacitor lower electrode, the PZT layer, and the capacitor upper electrode are formed on the adhesive layer. As a result separation of the capacitor lower electrode, which may occur in the prior art, can be effectively prevented. A silicification reaction, which may occur in the prior art, can also be effectively prevented, because the adhesive layer is formed of one material selected from a group consisting of high melting point metals and high melting point metal nitrides. In addition, a stepped portion seem in the prior art cannot be created on the capacitor lower electrode because of formation of the capacitor lower electrode, preventing the thickness of the PZT layer formed on the capacitor lower electrode from being thin at the stepped portion. Therefore, a narrow portion cannot be created between the capacitor upper electrode to be formed on the PZT layer and the capacitor lower electrode, and consequently the pressure-resistant and leakage-resistant characteristics of the capacitor can be improved compared to the prior art.

According to a further aspect of the invention, the semiconductor device having a capacitor for storing electric charges corresponding to a data signal includes a first capacitor lower electrode having a high melting point metal nitride layer at least at its surface portions, a second capacitor lower electrode formed of a high melting point noble metal layer and disposed on the surface of the first capacitor lower electrode, a zirconium lead titanate ceramic (PZT) layer formed on the second capacitor lower electrode, and a capacitor upper electrode formed on the zirconium lead titanate ceramic layer.

In operation, silicification reaction, which may occur between the first capacitor lower electrode and the second capacitor lower electrode in the prior art, can be prevented, because a first capacitor lower electrode having the high melting point noble metal nitride layer is formed at least at the surface portion of the first capacitor lower electrode, the second capacitor lower electrode formed of the high melting point noble metal layer is disposed on the surface of the high melting point metal nitride layer, and the zirconium lead titanate ceramic layer is formed on the second capacitor lower electrode. In a case that the second capacitor lower electrode is formed under the layer insulating film, the first capacitor lower electrode having the high melting point metal nitride layer is interposed between the interlayer insulating film and the second capacitor lower electrode, whereby adhesion of the second capacitor lower electrode formed of the high melting point noble metal is improved, and thus separation of the second capacitor lower electrode, which may occur in the prior art, can be effectively prevented.

A manufacturing method of a semiconductor device according to a further aspect of the invention includes the steps of forming an insulating layer on a semiconductor substrate, having its surface planarized with an aperture portion reaching the semiconductor substrate on a predetermined region; forming a plug electrode layer formed of at least one material selected from a group consisting of high melting point metals and high melting point metal nitrides, filling the aperture portion in contact with the semiconductor substrate therein and extending on and along the upper surface of the insulating layer, using a CVD method; forming a capacitor lower electrode formed of a high melting point noble metal layer on the plug electrode layer; forming a zirconium lead titanate ceramic (PZT) layer on the capacitor lower electrode; and forming a capacitor upper electrode on the PZT layer.

In operation, a stepped portion seen in the prior art cannot be created on the capacitor lower electrode, preventing the thickness of the PZT layer from being thin at the stepped portion, because the plug electrode layer is formed by the CVD method, filling the aperture portion of the insulating layer in contact with the semiconductor substrate therein and extending on and along the upper surface of the insulating layer, and the capacitor lower electrode, the PZT layer, and the capacitor upper electrode are sequentially formed on the plug electrode layer. Therefore, a thin portion between the capacitor upper electrode and the capacitor lower electrode seen in the prior art cannot be created, and thus a semiconductor device with improved pressure-resistant and leakage-resistant characteristics compared to the prior art can be readily manufactured. A silicification reaction of the capacitor lower electrode formed of a high melting point noble metal layer on the plug electrode layer can also be effectively prevented in a later heat treatment step, since the plug electrode layer is formed of at least one material selected from a group consisting of high melting point metals and high melting point metal nitrides.

A manufacturing method of a semiconductor device according to a further aspect of the invention includes the steps of forming an insulating layer on a semiconductor substrate, having its surface planarized with an aperture portion reaching the semiconductor substrate on a predetermined region; forming a conductive layer filling the aperture portion in contact with the semiconductor substrate therein and extending on and along the upper surface of the insulating layer; removing a conductive layer which exists on the upper surface of the insulating layer by etching back, as well as removing the conductive layer filled in the aperture portion for a predetermined thickness, to form a plug electrode; forming an adhesive layer formed of one material selected from a group consisting of high melting point metals and high melting point metal nitrides, electrically connected to the plug electrode in the aperture portion and extending on and along the upper surface of the insulating layer; forming on the adhesive layer a capacitor lower electrode formed of a high melting point noble metal layer; forming a zirconium lead titanate ceramic (PZT) layer on the capacitor lower electrode; and forming a capacitor upper electrode on the PZT layer.

In operation, the adhesive layer is formed electrically connected to the plug electrode formed in the aperture portion and extending on and along the upper surface of the insulating layer, and the capacitor lower electrode is formed thereon, whereby adhesion of the capacitor lower electrode formed of a high melting point noble metal layer is improved due to the adhesive layer. A silicification reaction of the capacitor lower electrode formed on the adhesive layer can also be effectively prevented in a later heat treatment step, because the adhesive layer is formed of one material selected from a group consisting of high melting point metals and high melting point metal nitrides.

A manufacturing method of a semiconductor device according to a further aspect of the invention includes the steps of forming a first capacitor lower electrode which has a high melting point metal nitride layer at least at its surface portion, forming a second capacitor lower electrode which is formed of a high melting point noble metal layer and is disposed on the first capacitor lower electrode, forming a zirconium lead titanate ceramic (PZT) layer on the second capacitor lower electrode, and forming a capacitor upper electrode on the zirconium lead titanate ceramic layer.

In operation, a silicification reaction is prevented between the first capacitor lower electrode and the second capacitor lower electrode in a later heat treatment step, even if the a portion of the first capacitor lower electrode other than the surface portion is formed of a silicon layer, because the first capacitor lower electrode is formed to have the high melting point metal nitride layer at least at its surface portion, the second capacitor lower electrode, which is formed of a high melting point noble metal layer, is formed on the first capacitor lower electrode, and the zirconium lead titanate ceramic (PZT) layer is formed on the second capacitor lower electrode. Also in a case that the first capacitor lower electrode is formed on the interlayer insulating film, the first capacitor lower electrode can have a good adhesion to the interlayer insulating film owing to the high melting point nitride layer contained therein. Thereby, such a disadvantage that the first capacitor lower electrode is separated from the interlayer insulating film can be prevented, and also separation of the second lower electrode, which is formed on the first capacitor lower electrode, can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

An embodiment of the invention will be described with reference to the drawings.

Figure 1:
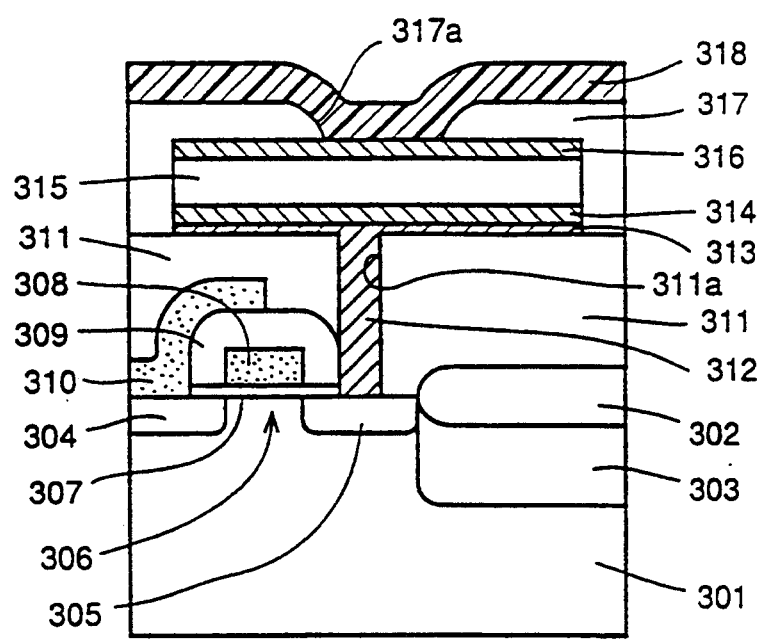
FIG. 1 is a cross section of a DRAM provided with a stacked type capacitor in accordance with a first embodiment of the invention.

FIG. 1 is a cross section of a DRAM provided with a stacked type capacitor in accordance with a first embodiment of the invention. Referring to FIG. 1, the DRAM of the first embodiment includes a silicon semiconductor substrate 301; an isolating oxide film 302 formed on a predetermined region on the surface of silicon semiconductor substrate 301 for isolating elements; a channel stopper layer 303 formed under isolating oxide film 302; a pair of source/drain regions 304 and 305 formed in an activated region surrounded by isolating oxide film 302; and located at opposite sides of a channel region 306 with a predetermined space therebetween; a gate electrode 308 formed on channel region 306 with a gate insulating film 307 interposed therebetween; an insulating film 309 formed to cover gate electrode 308; a buried bit line 310 formed to be electrically connected to source/drain region 304 and to extend on and along the surface of insulating film 309; an interlayer insulating film 311 formed to cover the whole surface and having its surface planarized with a contact hole 311a on source/drain region 305; a plug electrode layer 313 formed of TiN, electrically connected to source/drain region 305 in contact hole 311a and extending on and along the surface of interlayer insulating film 311; a platinum layer 314 to constitute a capacitor lower electrode formed on plug electrode layer 313; a zirconium lead titanate ceramic (PZT) film 315 formed on platinum layer 314; a capacitor upper electrode 316 formed of polysilicon, aluminum, aluminum alloy, tungsten, tungsten alloy or platinum on PZT film 315; an interlayer insulating film 317 formed to cover the whole surface and having a contact hole 317a on a predetermined region on the surface of capacitor upper electrode 316; and interconnection layer 318 formed of aluminum, electrically connected to capacitor upper electrode 316 in contact hole 317a extending on and along interlayer insulating film 317.

Figure 83:
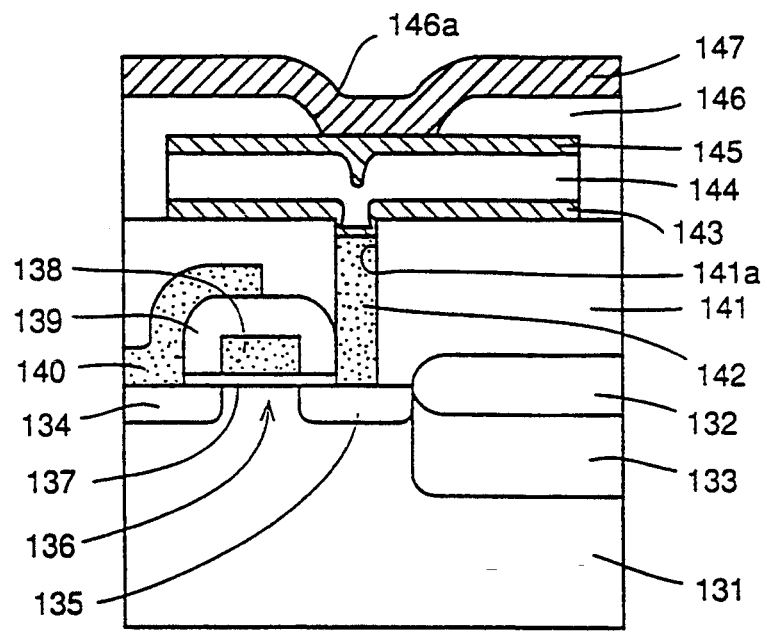
FIG. 83 is a cross section of an improved DRAM provided with a stacked type capacitor in the prior art.
Figure 84:
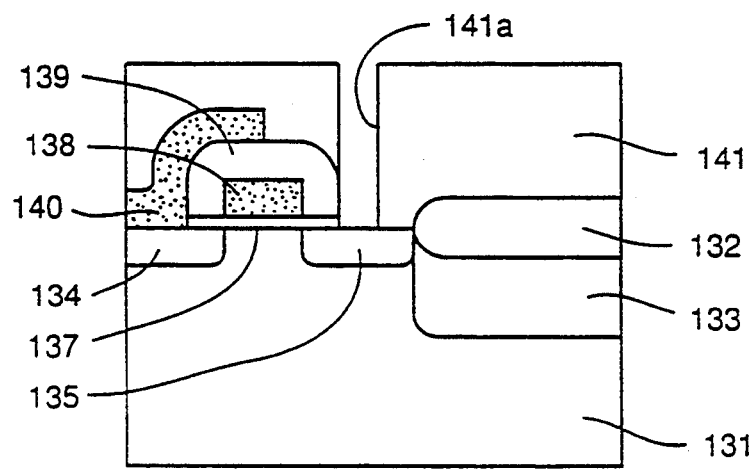
FIGS. 84 to 88 are cross sections showing the 1st to 5th steps in a manufacturing process of the improved DRAM in the prior art shown in FIG. 83.
Figure 85:
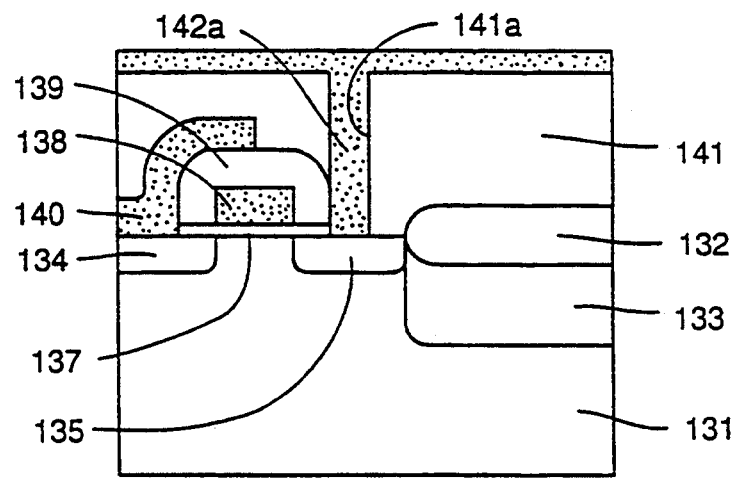
Figure 86:
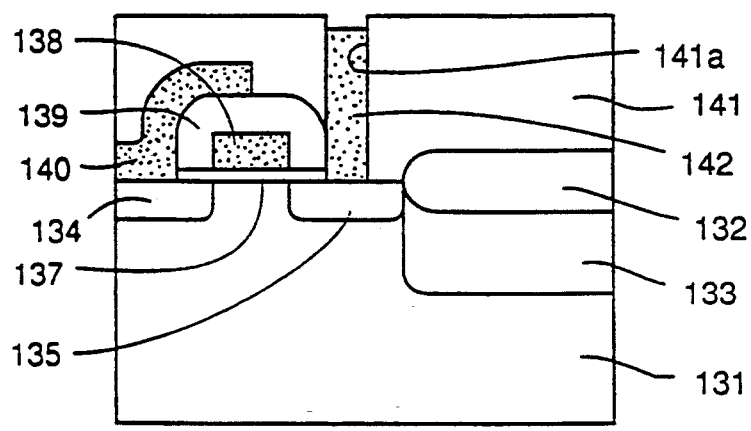
Figure 87:
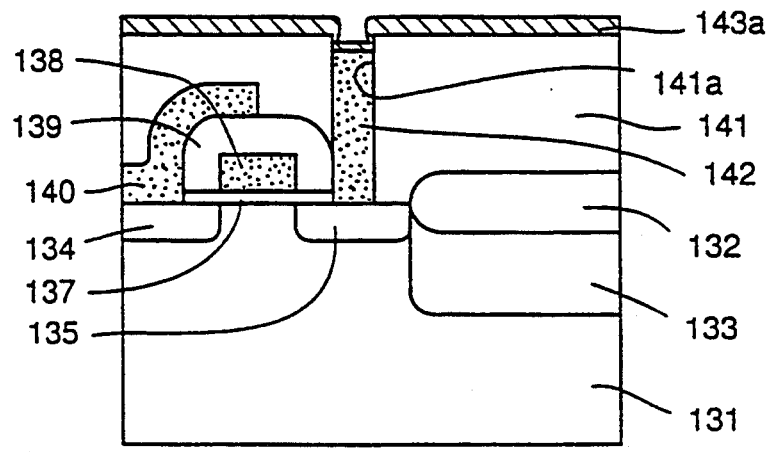
Figure 88:
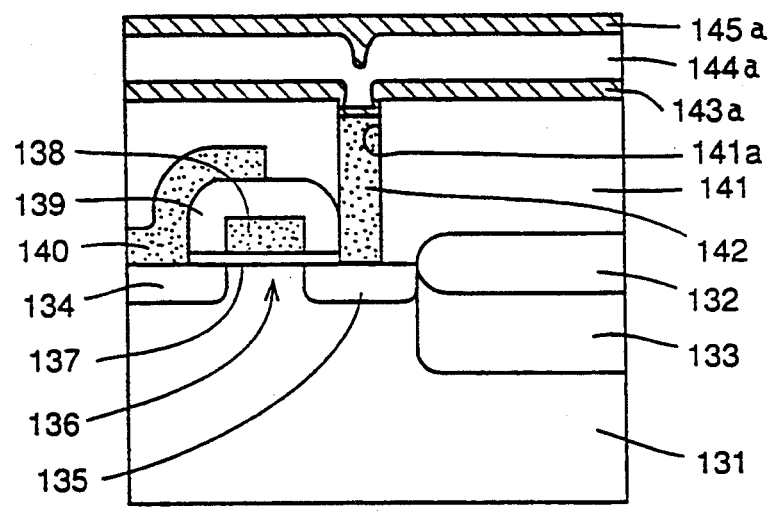

As described above, in the DRAM of the first embodiment, plug electrode layer 313 of TiN is formed buried in contact hole 311a and extending on and along the upper surface of interlayer insulating film 311, and platinum layer 314 to constitute the capacitor lower electrode is formed on plug electrode layer 313, whereby a stepped portion is not created on platinum layer 314 unlike the conventional DRAM shown in FIG. 83, and thus the thickness of PZT film 315 is not made partially thin. Therefore, the space between capacitor upper electrode 316 and platinum layer 314 constituting the capacitor lower electrode may not be partially narrow, or electric field concentration may not occur at the narrow portion, either. Consequently, pressure-resistant and leakage-resistant characteristics of a capacitor can be improved compared to those of the conventional DRAM shown in FIG. 83. A silicification reaction of platinum layer 314, which may occur in the prior art shown in FIG. 83, can also be prevented because plug electrode layer 313 is formed of TiN, one of high melting point metal nitrides. In other words, plug electrode layer 313 serves as a barrier layer, whereby a $SiO_2$ film having a low dielectric constant can be effectively prevented from forming at the interface of platinum layer 313 and PZT film 315 unlike in the prior art. As a result, performance of PZT film 315 can be maintained, and thus preventing decrease of the capacitor capacity caused by the capacitor insulating film itself.

In this embodiment, plug electrode layer 313 is prevented from separating from the upper surface of interlayer insulating film 311 because TiN having a good adhesion to interlayer insulating film 311 is used as plug electrode layer 313. Therefore platinum layer 314 formed on plug electrode layer 313 cannot be separated, and thus a capacitor which is stable in its structure can be formed. Paradium or gold may be used in place of platinum layer 314. Ti may also be used as plug electrode layer 313.

FIGS. 2 to 23 are cross sections showing a manufacturing process of the DRAM of the first embodiment shown in FIG. 1. Referring to FIG. 1 and FIGS. 2 to 13, a manufacturing process of the DRAM of the first embodiment will be described.

Figure 2:
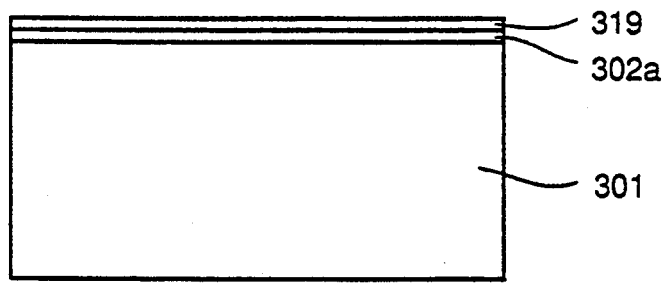
FIGS. 2 to 23 are cross sections showing the 1st to 22nd steps in a manufacturing process of the DRAM shown in FIG. 1 in accordance with the first embodiment of the invention.
Figure 3:
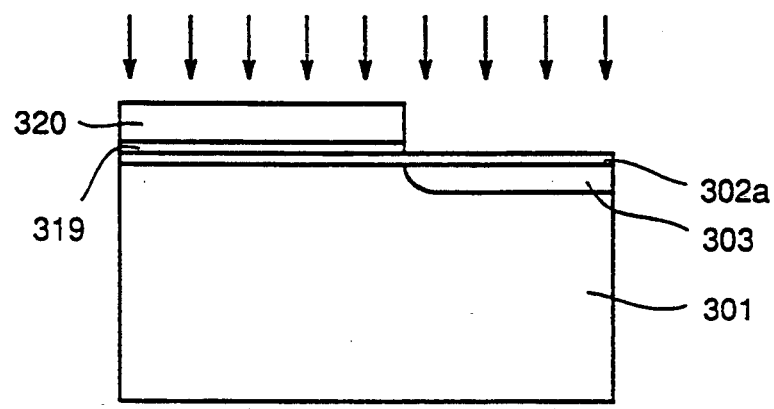

First, as shown in FIG. 2, an underlayer oxide film 302a is formed on silicon semiconductor substrate 301. A silicon nitride film 319 is formed on underlayer oxide film 302a. As shown in FIG. 3, a resist 320 is formed on a predetermined region on silicon nitride film 319 using photolithography. A predetermined region of silicon nitride film 319 is removed by anisotropic etching with resist 320 as a mask. Impurities for channel stopper layer 303 described later are introduced into silicon semiconductor substrate 301 by ion-implantation of impurities with silicon nitride film 319 and resist 320 as a mask. Thereafter, resist 320 is removed.

Figure 4:
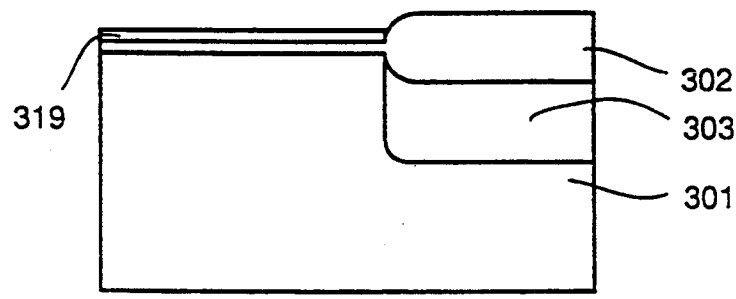
Figure 5:
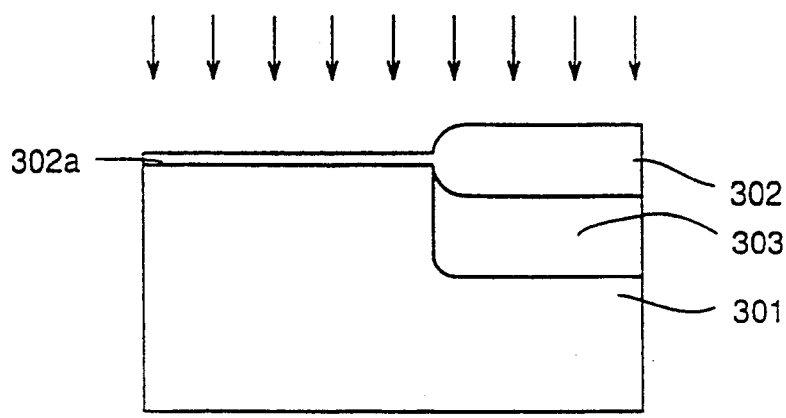

Then, as shown in FIG. 4, field oxide film (isolating oxide film) 302 is formed by thermal oxidation with silicon nitride film 319 as a mask. At the same time, channel stopper layer 303 is formed. Then, as shown in FIG. 5, impurities are ion-implanted into the whole surface, so that channel doping is effected to the active region surrounded by isolating oxide film 302. Thereafter, underlayer oxide film 302a is removed.

Figure 6:
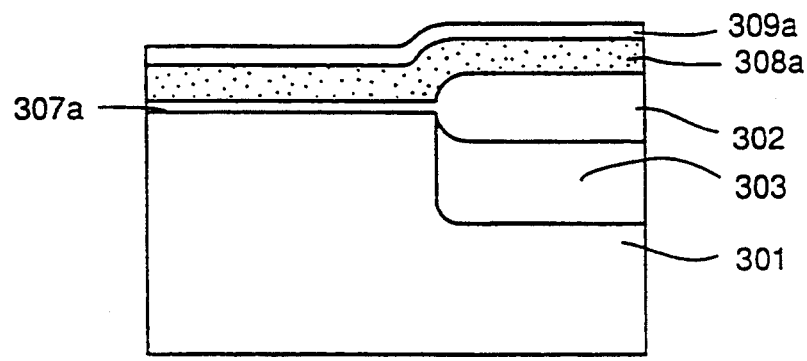

As shown in FIG. 6, a thermal oxidation method is used to form a gate oxide film layer 307a on the surface of silicon semiconductor substrate 301. A gate electrode layer 308a of impurity doped polysilicon is formed on the whole surface by the CVD method or the like. An oxide film 309a is formed on gate electrode layer 308a.

Figure 7:
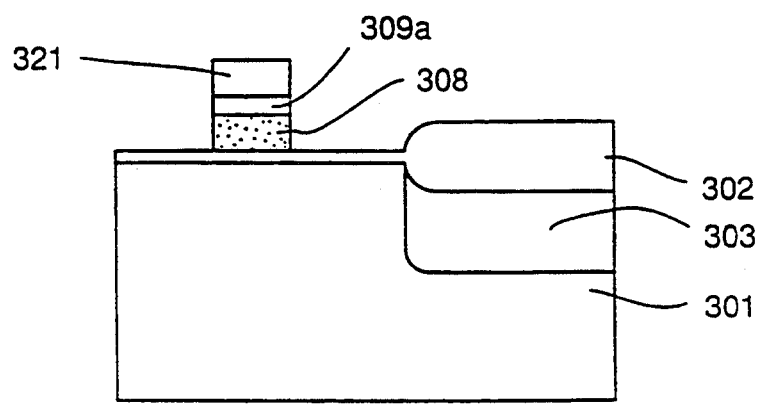
Figure 8:
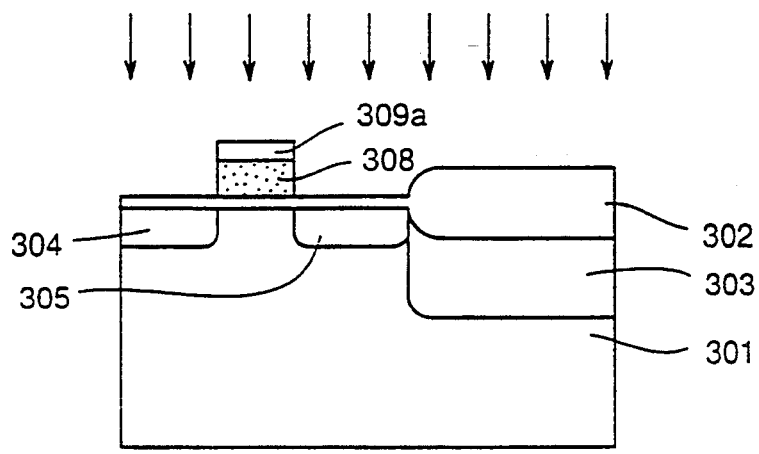

As shown in FIG. 7, a resist 321 is formed on a predetermined region of oxide film 309a using photolithography. Gate electrode 308 and oxide film 309a are formed by anisotropic etching with resist 321 as a mask. Thereafter, resist 321 is removed. As shown in FIG. 8, source/drain regions 304 and 305 are formed in a self-aligned manner by ion-implantation of impurities with gate electrode 308, oxide film 309a and isolation oxide film 302 as a mask.

Figure 9:
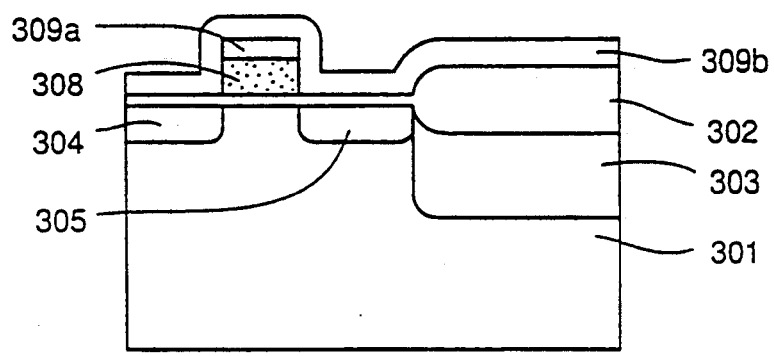
Figure 10:
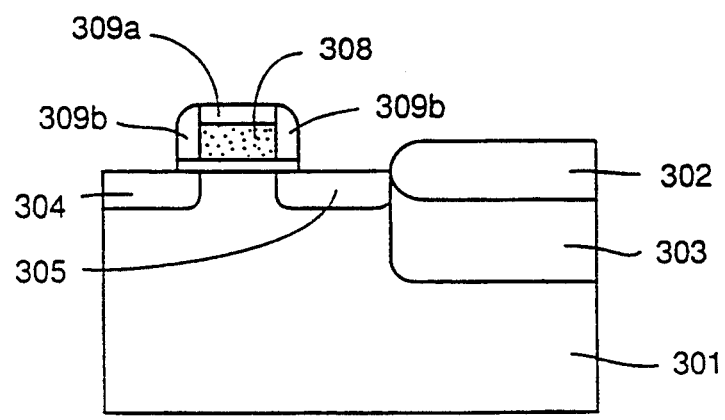

As shown in FIG. 9, an oxide film 309b is formed on the whole surface. As shown in FIG. 10, sidewalls 309b are formed in a self-aligned manner on both sides of gate electrode 308 by anisotropic etching of oxide film 309b, whereby gate electrode 308 is surrounded by insulating film 309 (309a and 309b).

Figure 11:
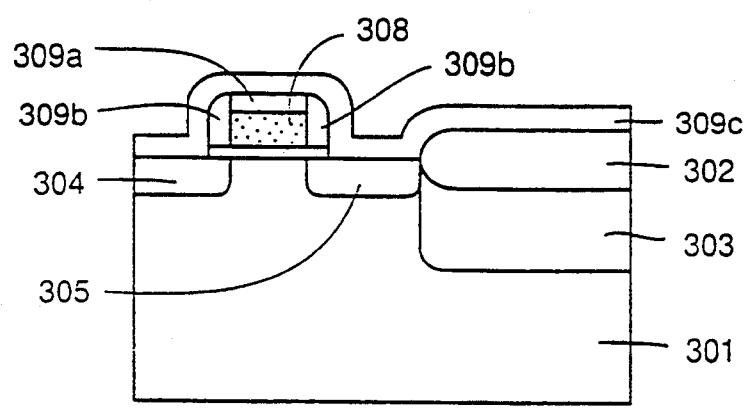
Figure 12:
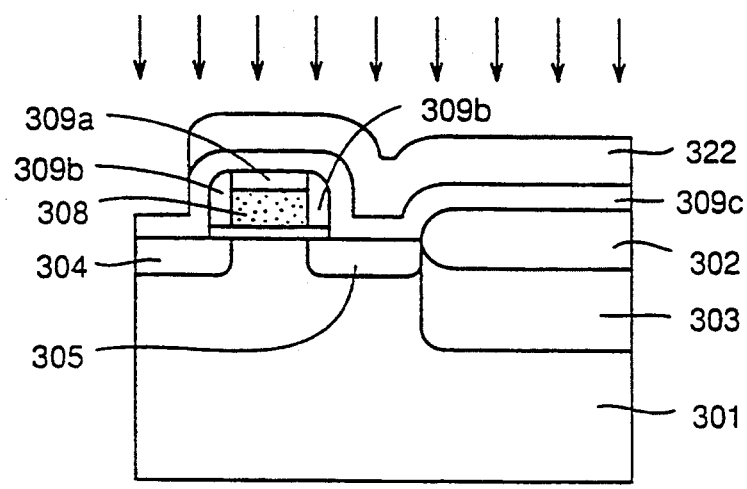
Figure 13:
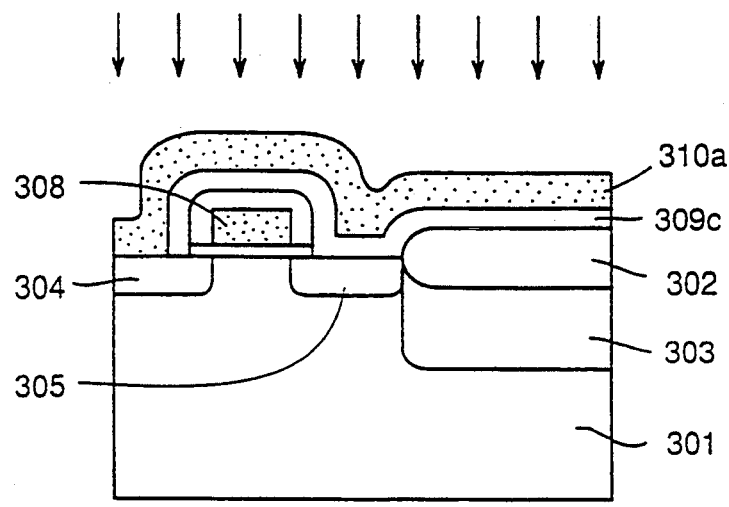

As shown in FIG. 11, an oxide film 309c is formed on the whole surface. As shown in FIG. 12, a resist 322 is formed on a predetermined region of oxide film 309c using photolithography. The surface region of source-drain region 304 is exposed by anisotropic etching with resist 322 as a mask. With oxide film 309c and resist 322 as a mask, ion-implantation is again effected to source/drain region 304. As shown in FIG. 13, polysilicon layer 310a is formed on the whole surface electrically connected to source/drain region 304. Impurities are ion-implanted into the whole surface of polysilicon layer 310a, so that polysilicon layer 310a is rendered conductive.

Figure 14:
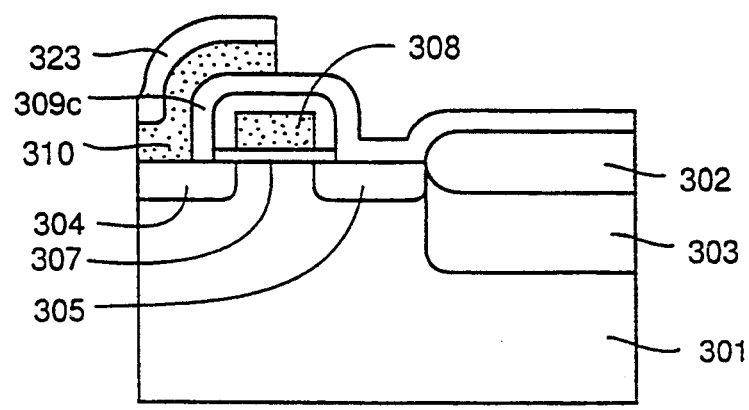

As shown in FIG. 14, a resist 323 is formed on a predetermined region on polysilicon layer 310a using photolithograhy. Buried bit line 310 is formed by anisotropic etching with resist 323 as a mask. Thereafter, resist 323 is removed.

Figure 15:
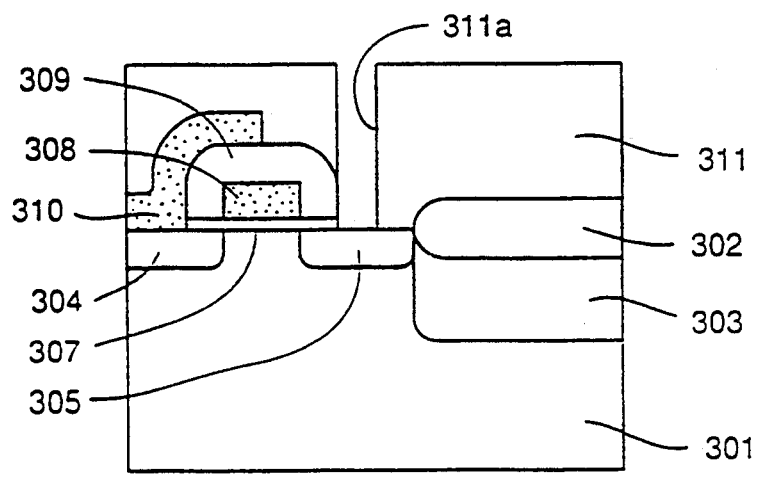
Figure 16:
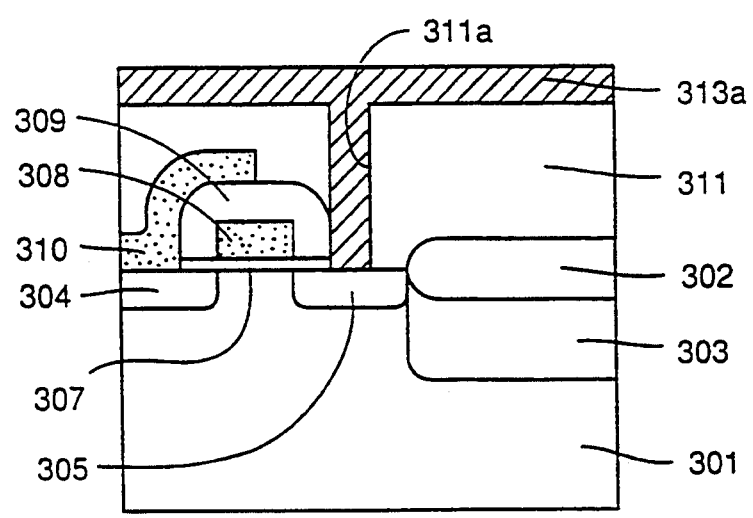
Figure 17:
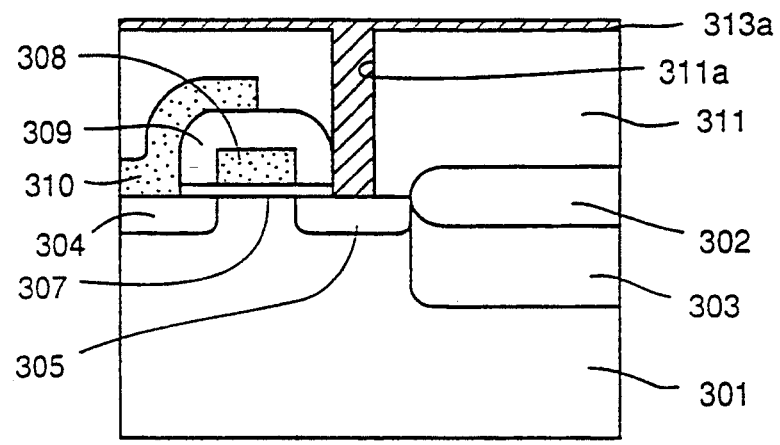

As shown in FIG. 15, interlayer insulating film 311 is formed on the whole surface. The upper surface of interlayer insulating film 311 is planarized by a reflow method or an etch-back method. Contact hole 311a is formed in interlayer insulating film 311 on source-drain region 305 using photolithography. As shown in FIG. 16, a TiN layer 313a is formed buried into contact hole 311a and extending on and along the upper surface of interlayer insulating film 311 by the CVD method with TiCl$_4$ and NH$_4$ as a source. As shown in FIG. 17, the thickness of TiN layer 313a on interlayer insulating film 311 is made approximately 10-50 nm by etching back TiN layer 313a.

Figure 18:
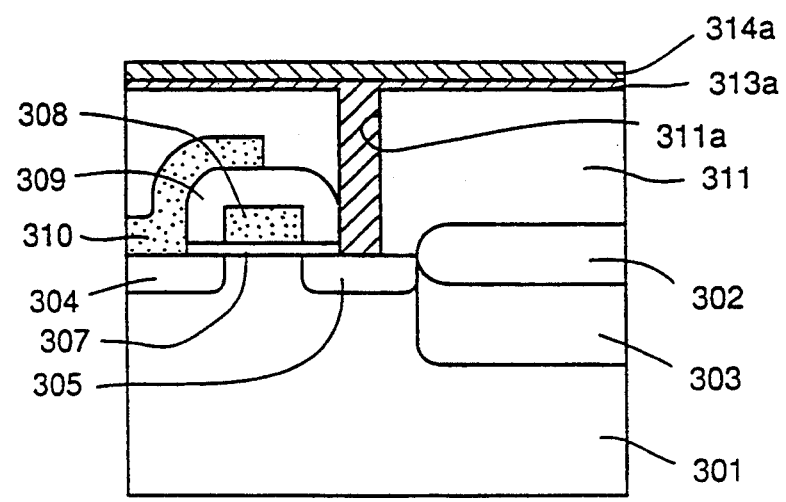
Figure 19:
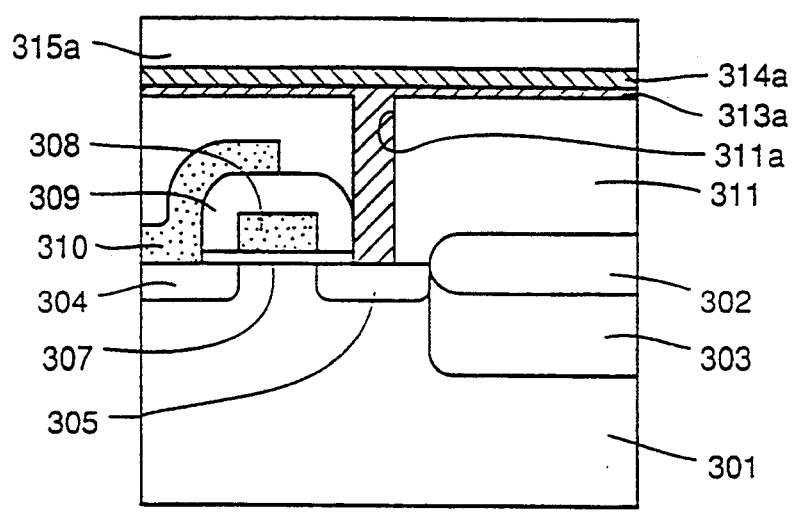

As shown in FIG. 18, a platinum layer 314a is formed on TiN layer 313a to have a thickness of approximately 50-100 nm and to constitute a capacitor lower electrode, using a sputter method. Platinum layer 314a may be formed of another high melting point nobel metal such as paradium or gold. As shown in FIG. 19, a zirconium lead titanate ceramic (PZT) layer 315a to constitute a capacitor insulating film is formed on platinum layer 314a to have a thickness of approximately 50-200 nm, by a solgel method, the sputter method, the CVD method, or the like. A PLZT layer may be used in place of a PZT layer 315a.

Figure 20:
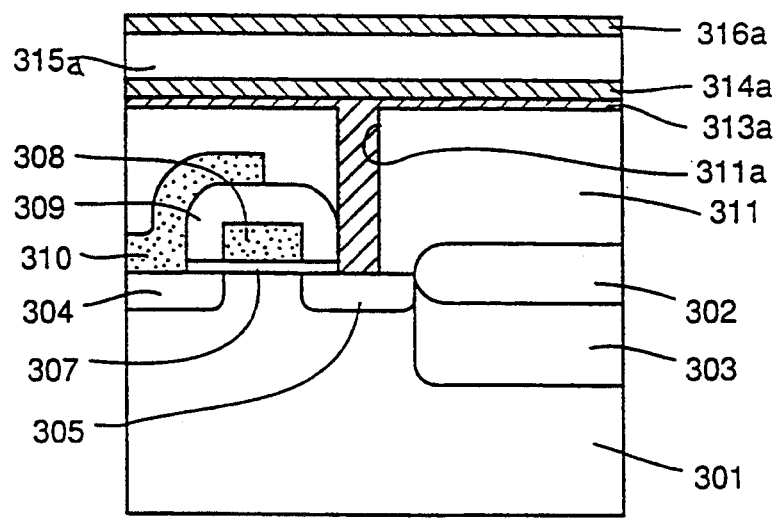
Figure 21:
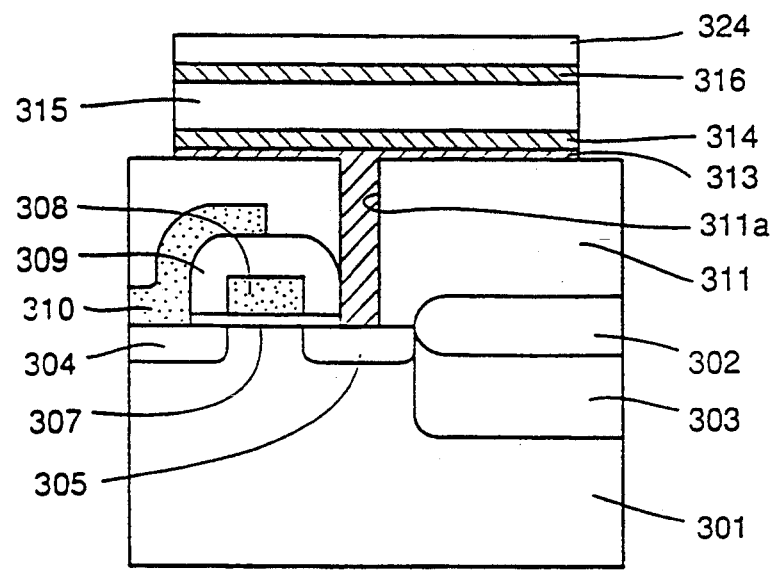

As shown in FIG. 20, a capacitor upper electrode layer 316a is formed of platinum (Pt), TiN, W or Al on PZT layer 315a. Thereafter, as shown in FIG. 21, a resist 324 is formed on a predetermined region of capacitor upper electrode layer 316a (see FIG. 20) using photolithography. Capacitor upper electrode 316, PZT film 315, platinum layer 314, and TiN layer 313 are formed by anisotropic etching with resist 324 as a mask. Thereafter, resist 324 is removed.

Figure 22:
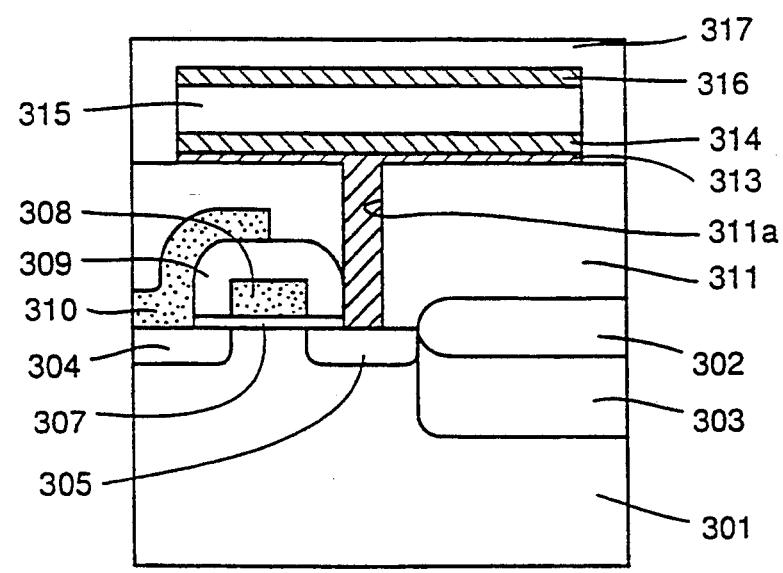
Figure 23:
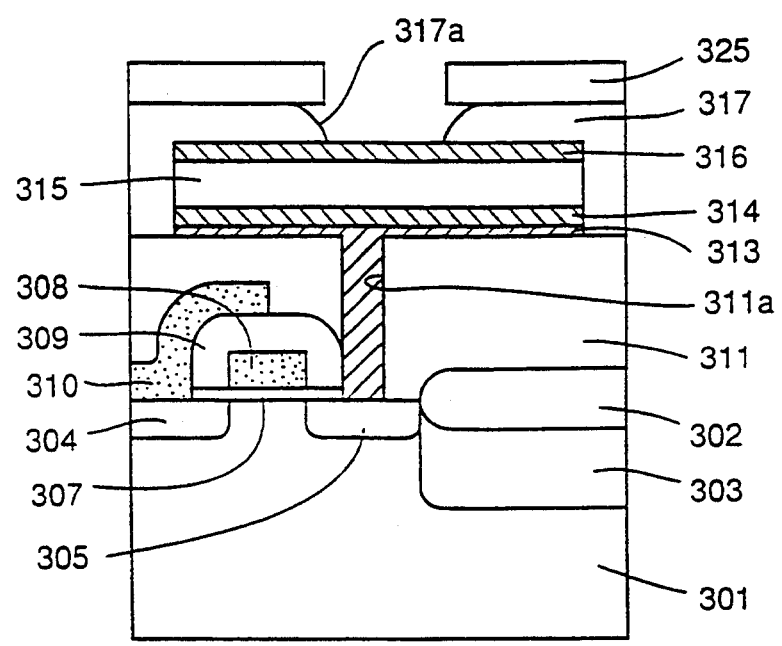

As shown in FIG. 22, interlayer insulating film 317 is formed on the whole surface. As shown in FIG. 23, a resist 325 is formed on a predetermined region on interlayer insulating film 317 using photolithography. Contact hole 317a is formed by isotropic etching of interlayer insulating film 317 with resist 325 as a mask, whereby a part of the surface region of capacitor upper electrode 316 is exposed. Thereafter, resist 325 is removed.

Finally, as shown in FIG. 1 interconnection layer 318 is formed electrically connected to capacitor upper electrode 316 in contact hole 317a and extending on and along interlayer insulating film 317. Interconnection layer 318 is formed of Al, W, WSi, or Cu or the like. Interconnection layer 318 is patterned by photolithography and etching. Although this embodiment is constituted to directly connect interconnection layer 318 and capacitor upper electrode 316, it is not restricted to this, and a barrier metal layer may be formed between interconnection layer 318 and capacitor upper electrode 316. The DRAM of the first embodiment is thus formed.

Figure 24:
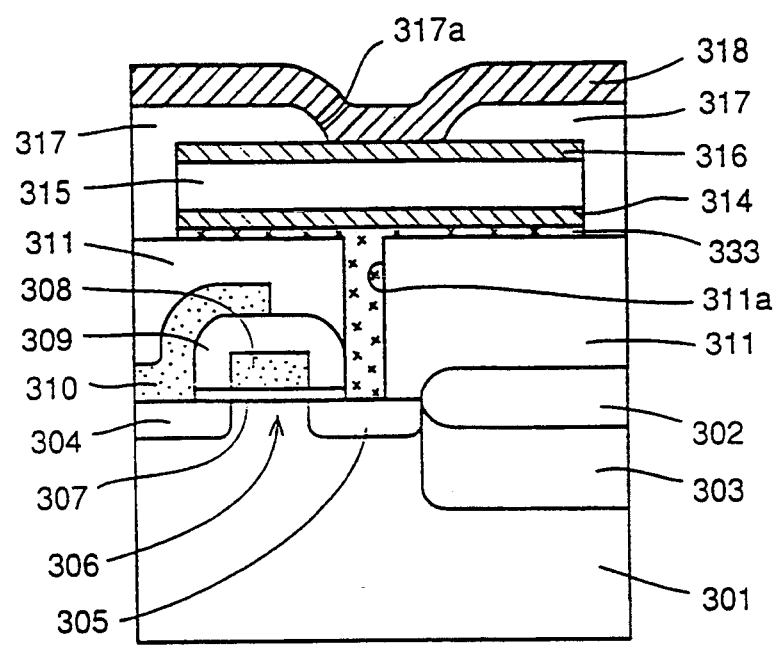
FIG. 24 is a cross section of a DRAM provided with a stacked type capacitor in accordance with a second embodiment of the invention.

FIG. 24 is a cross section of a DRAM provided with a stacked type capacitor according to a second embodiment of the invention. Referring to FIG. 24, in the second embodiment, a plug electrode layer 333 of tungsten (W) is used, in place of plug electrode layer 313 of a TiN layer shown in FIG. 1. The thickness of a portion of plug electrode layer 333 of W on interlayer insulating film 311 is approximately 10-50 nm. As a manufacturing process of plug electrode layer 333 of W, a W layer (not shown) is formed buried in contact hole 311a and extending on and along the surface of interlayer insulating film 311, and thereafter the surface of the W layer is etched back. In the second embodiment, a stepped portion seen in the prior art of FIG. 83 is not created on a platinum layer 314, because platinum layer 314 is formed to constitute a capacitor lower electrode on plug electrode layer 333 formed extending on the upper surface of interlayer insulating film 311. Therefore, the thickness of PZT layer 315 formed on platinum layer 314 is not made partially thin, and thus the space between capacitor upper electrode 316 and platinum layer 314 constituting a capacitor lower electrode is not made partially narrow. In the second embodiment, unlike the conventional DRAM shown in FIG. 83, pressure-resistant and leakage-resistant characteristics of a capacitor are not impaired, and thus improved. Also, a silicification reaction does not occur in platinum layer 314 because plug electrode layer 333 of W is formed under platinum layer 314.

Figure 25:
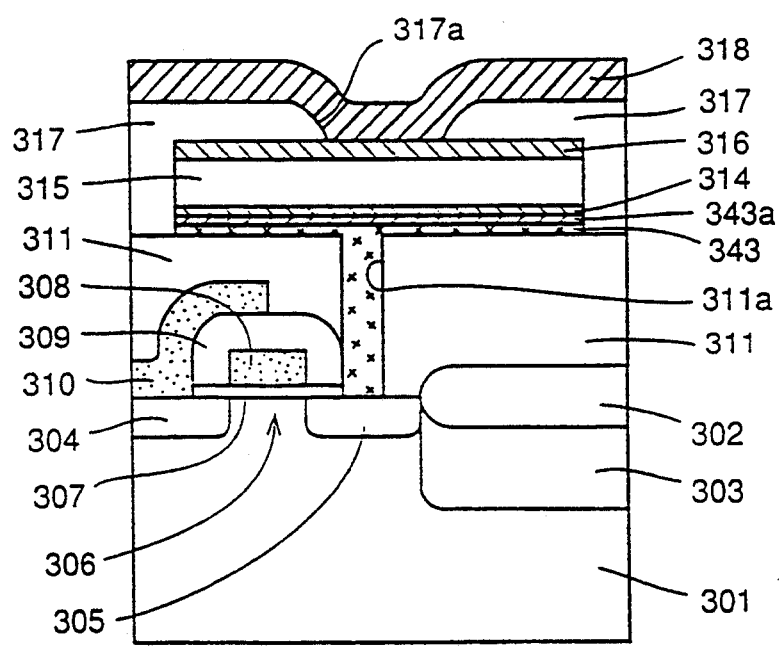
FIG. 25 is a cross section of a DRAM provided with a stacked type capacitor in accordance with a third embodiment of the invention.

FIG. 25 is a cross section showing a DRAM provided with a stacked type capacitor according to a third embodiment of the invention. Referring to FIG. 25, in the third embodiment, plug electrode layer 343 is formed of W, and a WN layer 343a is formed on the upper surface of plug electrode layer 343. It is thus constituted for the following reason. That is, if plug electrode layer 343 of W is subjected to a high temperature not less than 400° C. in an oxidizing atmosphere in later process, its surface is oxidized and changed into WO$_3$. As a result, a disadvantage occurs that its shape is changed as well as its electrical characteristic is impaired. In the third embodiment, in order to prevent such a disadvantage, WN layer 343a is formed on the surface region of plug electrode layer 343 of W.

FIGS. 26 to 29 are cross sections showing a manufacturing process of the DRAM of the third embodiment shown in FIG. 25. Referring to FIG. 25 and FIGS. 26 to 29, a manufacturing process of the DRAM of the third embodiment will be described.

Figure 26:
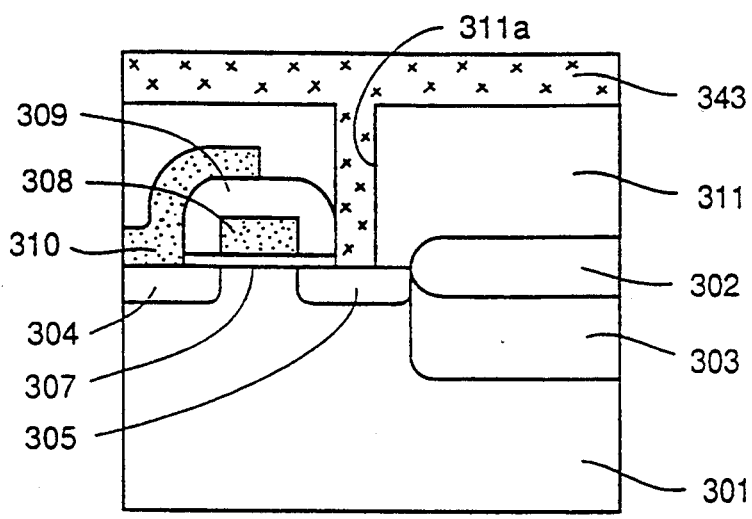
FIGS. 26 to 29 are cross sections showing the 1st to 4th steps in a manufacturing process of the DRAM shown in FIG. 25 in accordance with the third embodiment of the invention.
Figure 27:
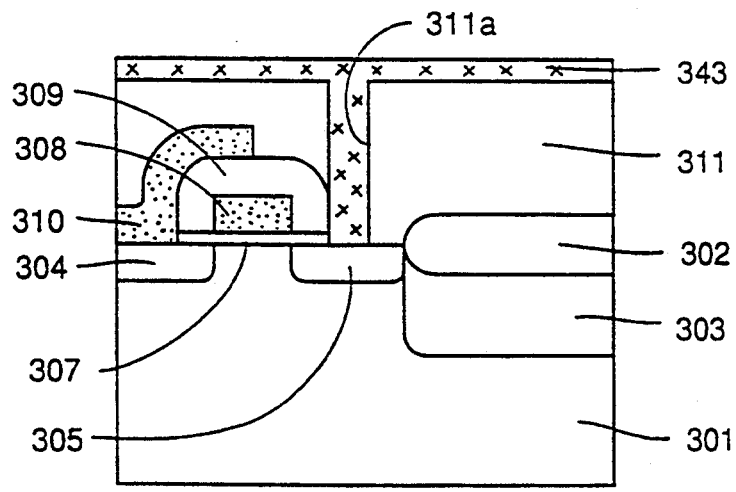
Figure 28:
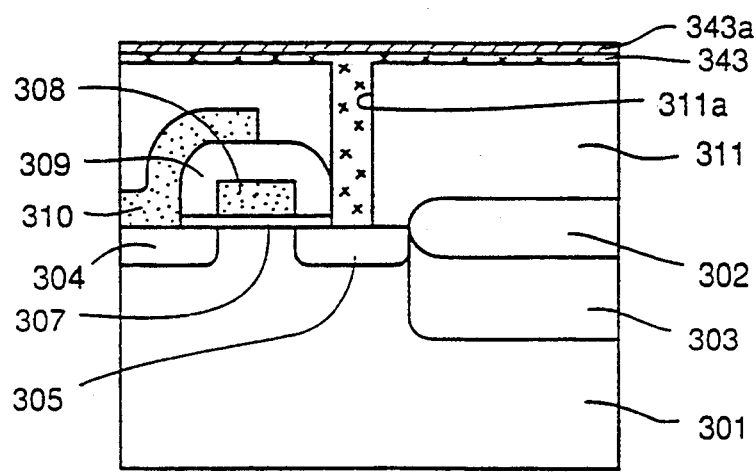
Figure 29:
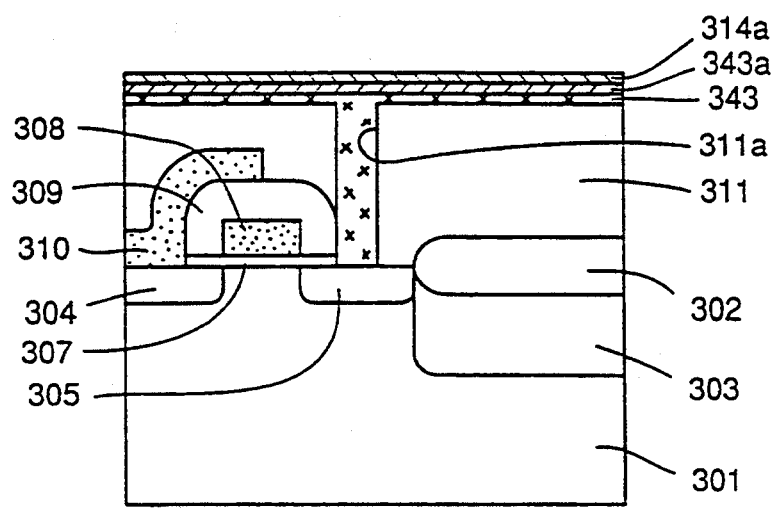

First, as shown in FIG. 26, the same steps of the manufacturing process of the first embodiment shown in FIGS. 2 to 15, up to forming interlayer insulating film 311 and contact hole 311a, are carried out. Thereafter, plug electrode layer 343 of W is formed using the CVD method. As shown in FIG. 27, the upper surface of plug electrode layer 343 is etched back, so that the thickness of plug electrode layer 343 on interlayer insulating film 311 is made approximately 10–50 nm. As shown in FIG. 28, the upper surface of plug electrode layer 343 of W is held at a high temperature in a nitriding atmosphere to be nitrided. Preferably, it is nitrided by being exposed in an $NH_3$ atmosphere under the temperature condition of 800° C. for 30 seconds. As a result, WN layer 343a having a thickness of approximately 5–30 nm is formed on the upper surface of plug electrode layer 343 of W. As shown in FIG. 29, platinum layer 314 is formed on WN layer 343a to constitute a capacitor lower electrode, using the sputter method. Thereafter, the same steps as those of the manufacturing process of the first embodiment shown in FIGS. 19 to 23 are carried out, and the DRAM of the third embodiment shown in FIG. 25 is completed.

Figure 30:
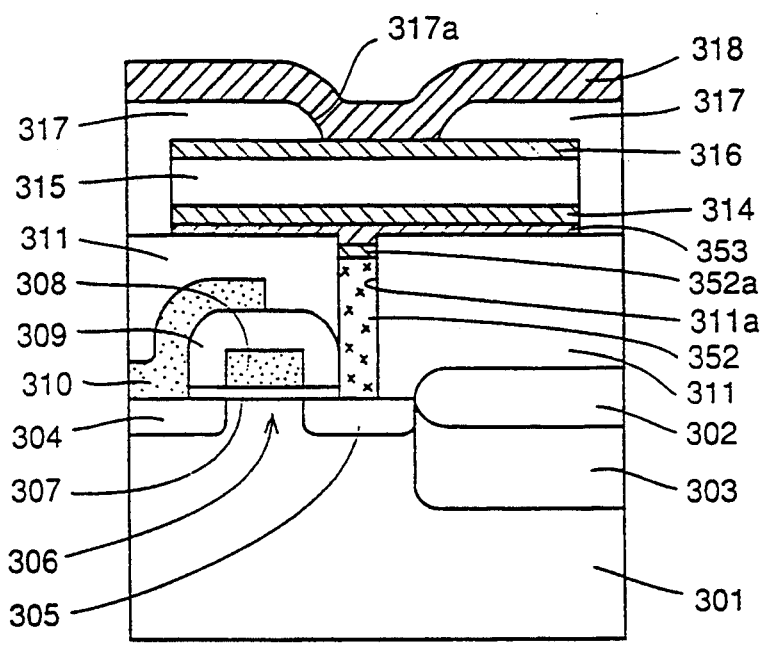
FIG. 30 is a cross section of a DRAM provided with a stacked type capacitor in accordance with a fourth embodiment of the invention.

FIG. 30 is a cross section showing a DRAM provided with a stacked type capacitor according to a fourth embodiment of the invention. Referring to FIG. 30, in the DRAM of the fourth embodiment, a tungsten (W) plug 352 is buried in contact hole 311a. A WN layer 352a having a thickness of approximately 5–30 nm is formed on the upper surface of tungsten plug 352. An adhesive layer 353 of Ti is formed in contact with WN layer 352a in contact hole 311a and extending on and along the upper surface of interlayer insulating film 311. The thickness of adhesive layer 353 on the upper surface of interlayer insulating film 311 is 30–70 nm. Also in the fourth embodiment, adhesive layer 353 is formed extending on and along the upper surface of interlayer insulating film 311, and platinum layer 314 to constitute a capacitor lower electrode is formed on adhesive layer 353, whereby a stepped portion is not created on platinum layer 314 to constitute a capacitor lower electrode, unlike the prior art in FIG. 83. Therefore, the thickness of PZT film 315 formed on platinum layer 314 is not made partially thin, and thus the space between platinum layer 314 constituting a capacitor lower electrode and capacitor upper electrode 316 is not made partially narrow. As a result, unlike the conventional DRAM shown in FIG. 83, a disadvantage does not occur that pressure-resistant and leakage-resistant characteristics of a capacitor are impaired. In the fourth embodiment, separation of platinum layer 314 is also effectively prevented, due to adhesive layer 353 of Ti having a good adhesion to interlayer insulating film 311. Further, a silicification reaction, which may be occurred in the prior art, can be effectively prevented, because adhesive layer 353 of Ti is formed under platinum layer 314.

Figure 31:
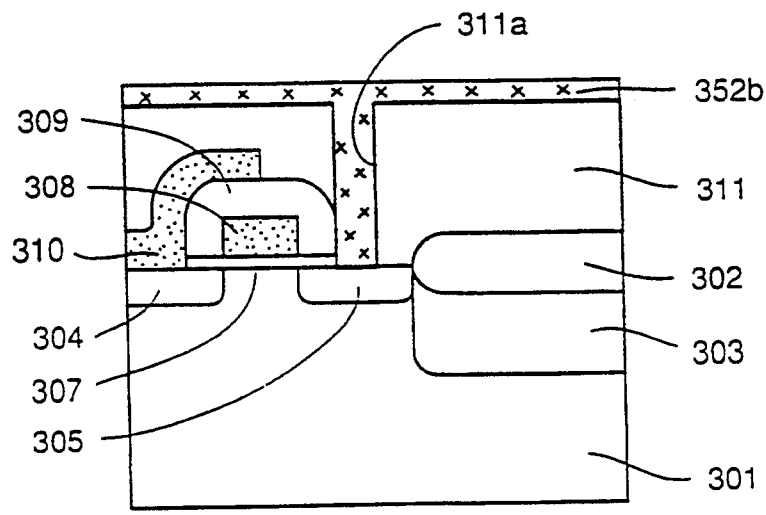
FIGS. 31 to 34 are cross sections showing the 1st to 4th steps in a manufacturing process of the DRAM shown in FIG. 30 in accordance with the fourth embodiment of the invention.
Figure 32:
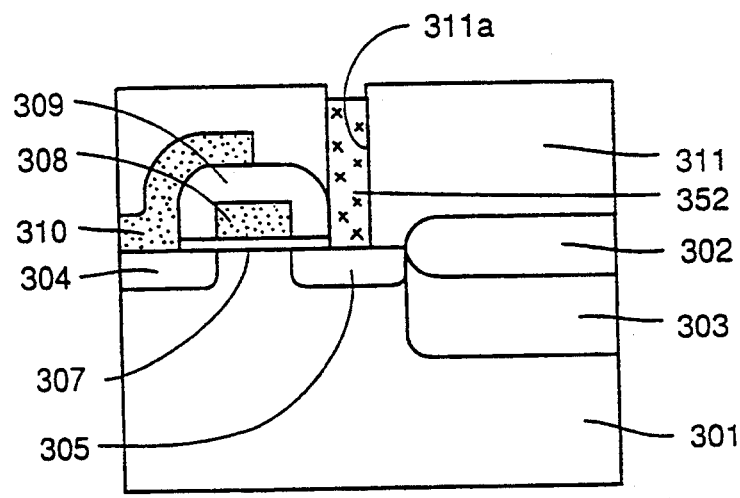
Figure 33:
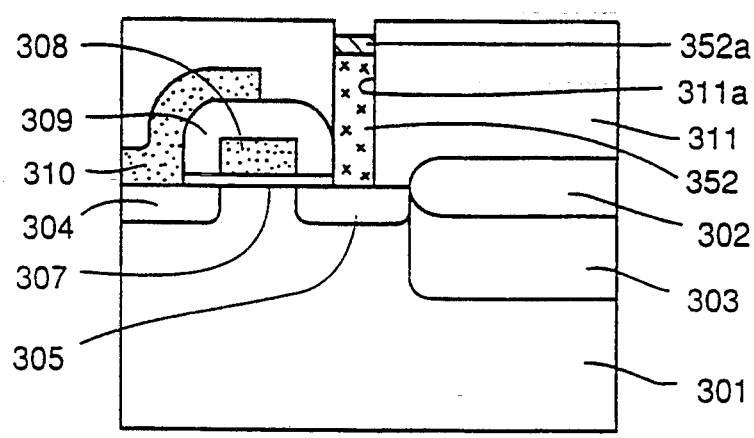
Figure 34:
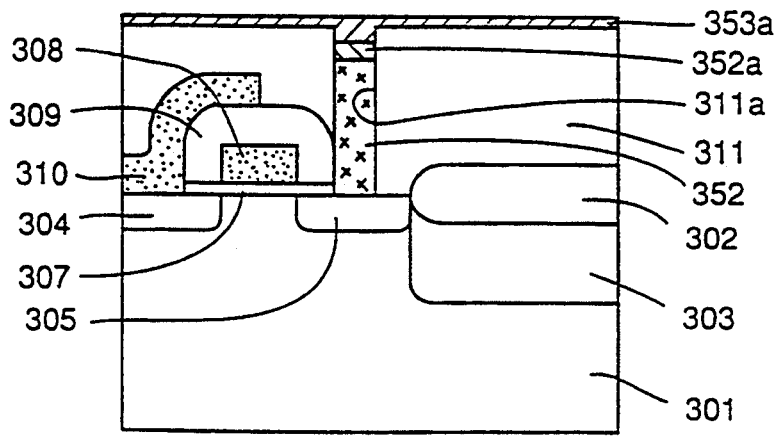

FIGS. 31 to 34 are cross section showing a manufacturing process of the fourth embodiment shown in FIG. 30. Referring to FIG. 30 and FIGS. 31 to 34, a manufacturing process of the DRAM of the fourth embodiment will be described. First, as shown in FIG. 31, the same steps as those of the manufacturing process of the first embodiment shown in FIGS. 2 to 15, up to forming contact hole 311a, are carried out. Thereafter, a W layer 352b is formed buried in contact hole 311a and extending on and along interlayer insulating film 311 using the CVD method. Tungsten (W) plug 352 shown in FIG. 32 is formed by etching back W layer 352b. When W layer 352b is etched back, it is somewhat overetched in order to completely remove residues on interlayer insulating film 311. Therefore, tungsten (W) plug 352 has its upper surface sunken in contact hole 311a. Thereafter, as shown in FIG. 33, the upper surface of tungsten plug 352 is held at a high temperature in a nitriding atmosphere to be nitrided. WN layer 352a having a thickness of approximately 5–30 nm is thus formed on the upper surface of tungsten plug 352. As shown in FIG. 34, a TiN layer 353a in contact with WN layer 352a in contact hole 311a and extending along the upper surface of interlayer insulating film 311 is formed to have a thickness of approximately 30–70 nm on the upper surface of interlayer insulating film 311. Then, the same steps as those of the manufacturing process of the first embodiment shown in FIGS. 18 to 23 are carried out, and the DRAM of the fourth embodiment shown in FIG. 30 is completed.

Figure 35:
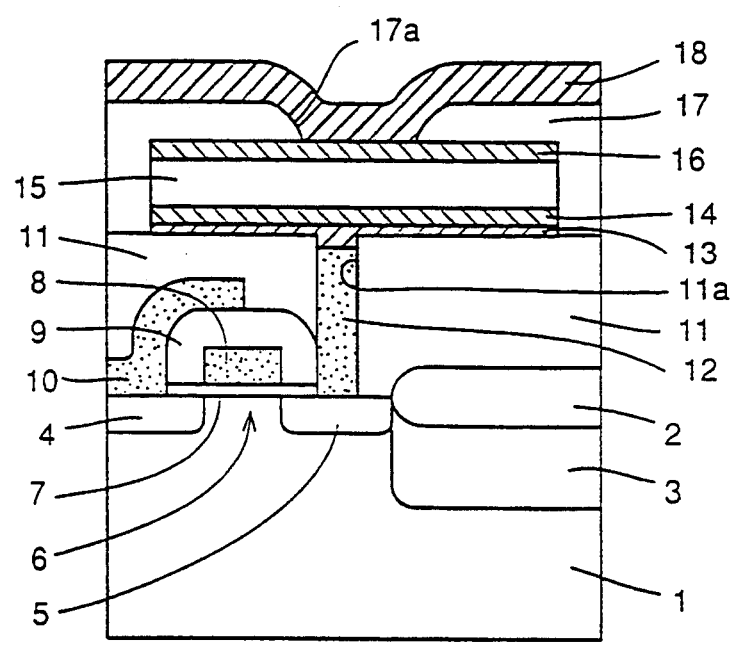
FIG. 35 is a cross section of a DRAM provided with a stacked type capacitor in accordance with a fifth embodiment of the invention.

Referring to FIG. 35, a DRAM of a fifth embodiment includes a silicon semiconductor substrate 1 as well as following components and portions. An isolating oxide film 2 for isolating elements is formed on a predetermined region of a major surface of silicon semiconductor substrate 1. A channel stopper layer 3 is formed in a region under isolating oxide film 2. Source/drain regions 4 and 5 are formed in a region surrounded by isolating oxide film 2 and are located at opposite sides of a channel region 6 with a predetermined space therebetween. A gate electrode 8 is formed on channel region 6 with a gate insulating film 7 therebetween. Gate electrode 8 is covered with an insulating film 9. A buried bit line 10 is electrically connected to source/drain region 4 and extends on and along insulating film 9. An interlayer insulating film 11 covering the whole surface has a contact hole 11a located above source/drain region 5. An interconnection layer 12 formed of polysilicon is buried in contact hole 11a and is electrically connected to source/drain region 5. A titanium nitride layer 13 extends on and along interlayer insulating film 11 and interconnection layer 12 and is electrically connected to interconnection layer 12. A platinum layer 14 is formed on titanium nitride layer 13. A zirconium lead titanate ceramic (PZT) film 15 is formed on platinum layer 14 to form a capacitor insulating film. A capacitor upper electrode 16 formed of platinum, titanium nitride, tungsten or aluminum is formed on PZT film 15. An interlayer insulating film 17 covering the whole surface has a contact hole 17a on a predetermined region of capacitor upper electrode 16. An interconnection layer 18 formed of aluminum, tungsten, tungsten silicide or copper is electrically connected through contact hole 17a to capacitor upper electrode 16 and extends on and along interlayer insulating film 17.

Gate electrode 8 and a pair of source/drain regions 4 and 5 form a transfer gate transistor of a memory cell. In this embodiment, the buried bit line structure, i.e., the structure having the buried bit line enables formation of the capacitor lower electrode which has a portion extended above buried bit line 10. Thereby, a capacitor capacity enough for memory storage can be ensured even in a case that the elements are further miniaturized in accordance with the high integration of the semiconductor device. In this embodiment, since PZT film 15 having a high dielectric constant is used as the capacitor insulating film, capacitor insulating film itself can increase its capacitor capacity.

In this fifth embodiment, titanium nitride layer 13 is interposed between platinum layer 14, which forms the capacitor lower electrode, and interconnection layer 12. This achieves the following particular effect.

The interposition of titanium nitride layer 13 between platinum layer 14 and the interconnection layer 12 formed of polysilicon can effectively prevent the silicification reaction of interconnection layer 12 formed of polysilicon and platinum layer 14, which may occur in a later heat treatment step. Thus, titanium nitride layer 13 serves as a barrier layer. This effectively prevents the formation of $SiO_2$ film having a low dielectric constant, which may be formed at an interface between platinum layer 14 and PZT film 15 in the prior art. As a result, the performance of the PZT film can be maintained, and thus reduction of capacitor capacity, which may be caused due to capacitor insulating film itself, can be prevented.

In this fifth embodiment, titanium nitride layer 13 having good adhesion to interlayer insulating film 11 is formed on interlayer insulating film 11, so that titanium nitride layer 13 is prevented from being separated from interlayer insulating film 11. As a result, separation of platinum layer 14 formed on titanium nitride layer 13, which may occur in the prior art, is prevented, and thus the capacitor also having a stable structure can be formed. Layer 14 may be formed of palladium or gold instead of platinum.

A manufacturing process of the DRAM of the embodiment will be described below with reference to FIG. 35 as well as FIGS. 36–57.

Figure 36:
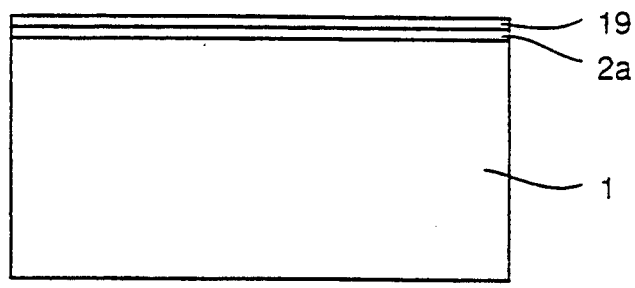
FIGS. 36 to 57 are cross sections showing the 1st 22nd steps in a manufacturing process of the DRAM shown in FIG. 35 in accordance with the fifth embodiment of the invention.

As shown in FIG. 36, an underlayer oxide film 2a is formed on silicon semiconductor substrate 1. Silicon nitride film 19 is formed on underlayer oxide film 2a.

Figure 37:
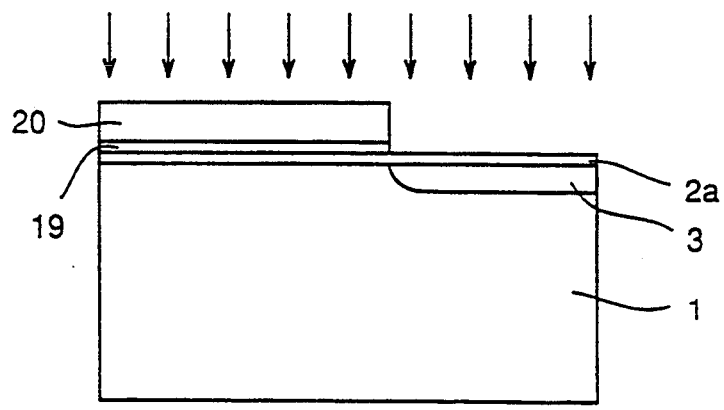

Then, as shown in FIG. 37, a resist 20 is formed on a predetermined region of silicon nitride film 19, using photolithography. Using resist 20 as a mask, anisotropic etching is done to remove a predetermined region of silicon nitride film 19. Using silicon nitride film 19 and resist 20 as a mask, impurities are ion-implanted to introduce the impurities, which are used for channel stopper layer 3 described later, into silicon semiconductor substrate 1. Thereafter, resist 20 is removed.

Figure 38:
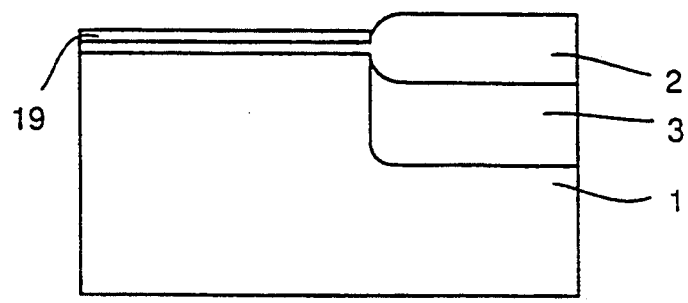

Then, as shown in FIG. 38, silicon nitride film 19 is used as a mask for thermal oxidation, by which field oxide film (isolating oxide film) 2 is formed and simultaneously a channel stopper layer 3 is formed.

Figure 39:
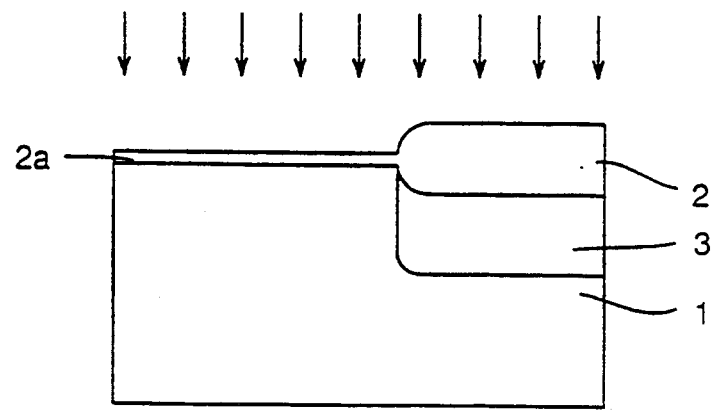

Then, as shown in FIG. 39, impurities are ion-implanted into the whole surface, so that channel doping is applied to the active region surrounded by isolating oxide film 2. Thereafter, underlayer oxide film 2a is removed.

Figure 40:
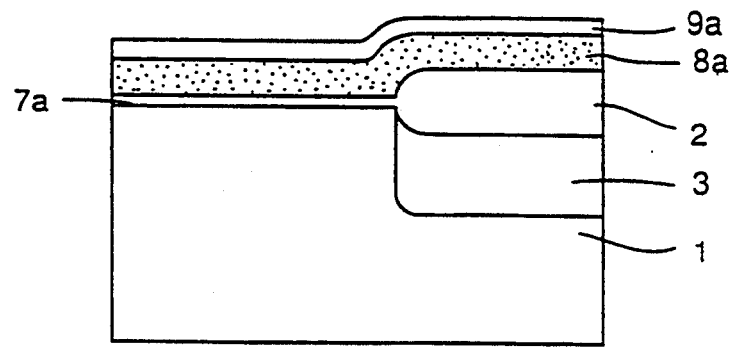
Figure 41:
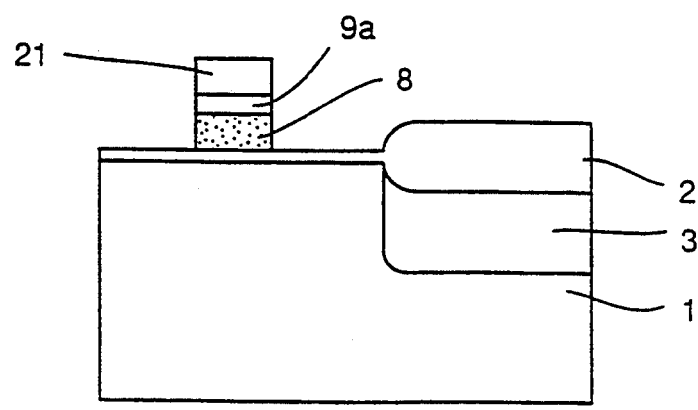

Then, as shown in FIG. 40, the thermal oxidation method is used to form a gate oxide film layer 7a on the surface of silicon semiconductor substrate 1. A gate electrode layer 8a, which is formed of impurity doped polysilicon, is formed on the whole surface, by CVD method or the like. An oxide film 9a is formed on gate electrode Layer 8a. As shown in FIG. 41, a resist 21 is formed on a predetermined region of oxide film 9a, using the photolithography. Anisotropic etching is done, using resist 21 as a mask, to form gate electrode 8 and oxide film 9a. Thereafter, resist 21 is removed.

Figure 42:
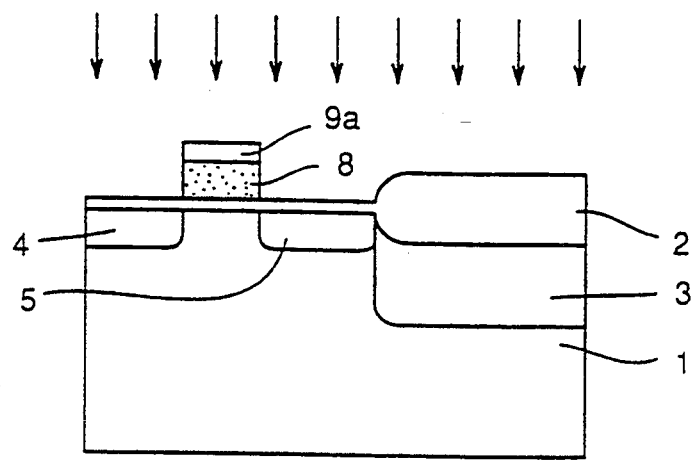

Then, as shown in FIG. 42, gate electrode 8, oxide film 9a and oxide film 2 are used as a mask for ion-implanting the impurities, by which source/drain regions 4 and 5 are formed in a self-aligned manner.

Figure 43:
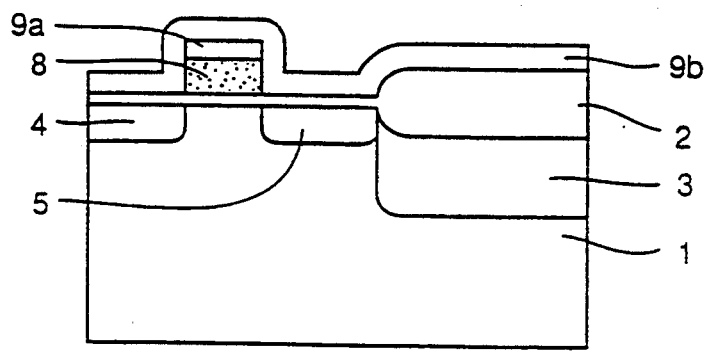

Then, as shown in FIG. 43, an oxide film 9b is formed on the whole surface.

Figure 44:
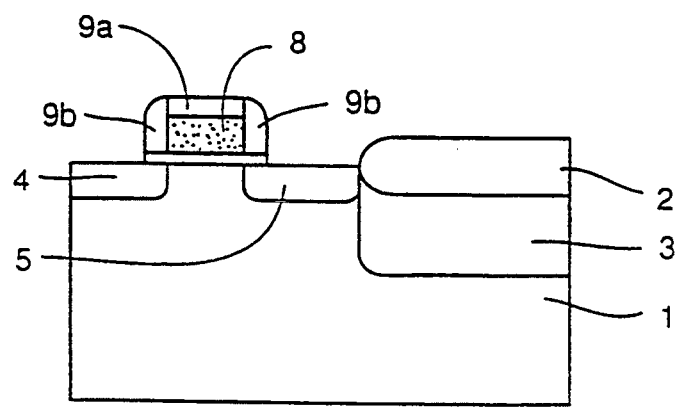

Then, as shown in FIG. 44, oxide film 9b is subjected to the anisotropic etching, whereby sidewalls 9b are formed in a self-aligned manner on opposite sidewalls of gate electrode 8. Thereby, gate electrode 8 is surrounded by insulating film 9 (9a and 9b).

Figure 45:
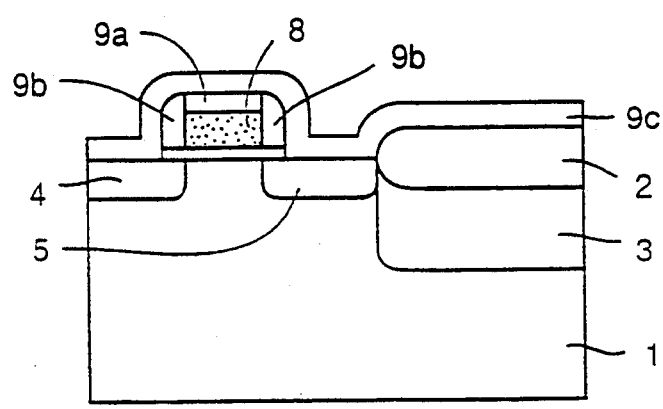

Then, as shown in FIG. 45, oxide film 9c is formed on the whole surface.

Figure 46:
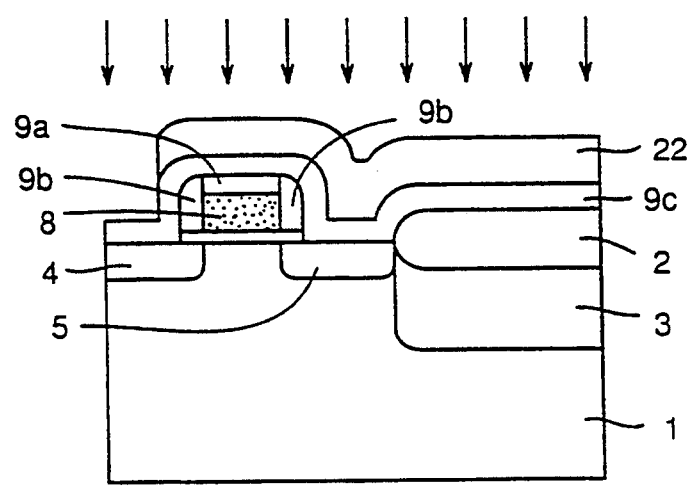

Then, as shown in FIG. 46, resist 22 is formed on a predetermined region of oxide film 9c, using photolithography. Resist 22 is used as a mask for anisotropic etching, by which the surface region of source/drain region 4 is exposed. Using oxide film 9c and resist 22 as a mask, ion-implantation is effected on source/drain region 4 again.

Figure 47:
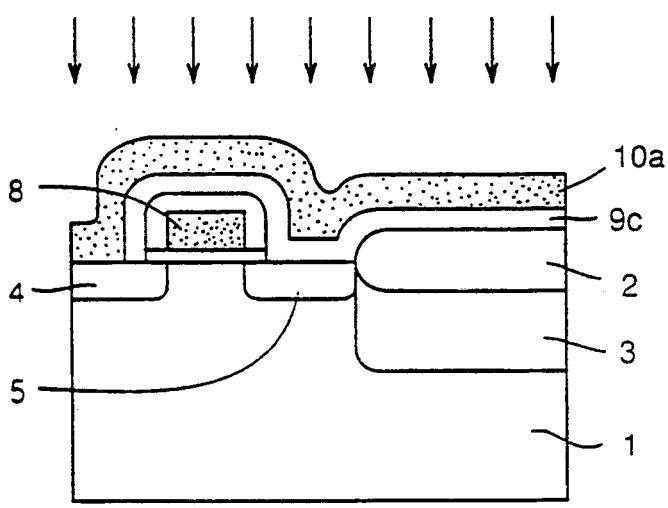

Then, as shown in FIG. 47, polysilicon layer 10a is formed on the whole surface and is electrically connected to source/drain region 4. Impurities are ion-implanted into the whole surface of polysilicon layer 10a, so that polysilicon layer 10a has conductivity.

Figure 48:
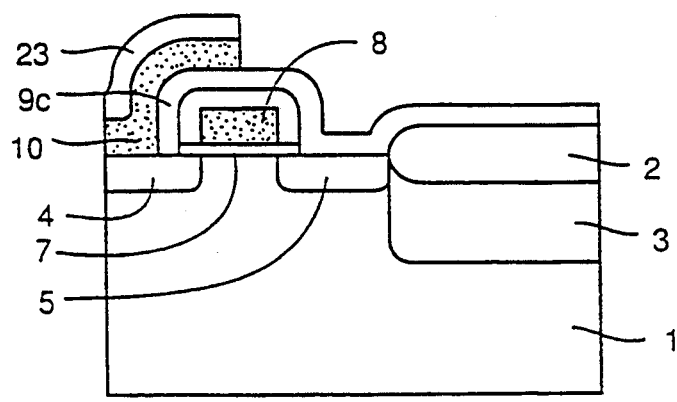

Then, as shown in FIG. 48, photolithography is used to form a resist 23 on a predetermined region of polysilicon layer 10a. Using resist 23 as a mask, anisotropic etching is done to form buried bit line 10. Thereafter, resist 23 is removed.

Figure 49:
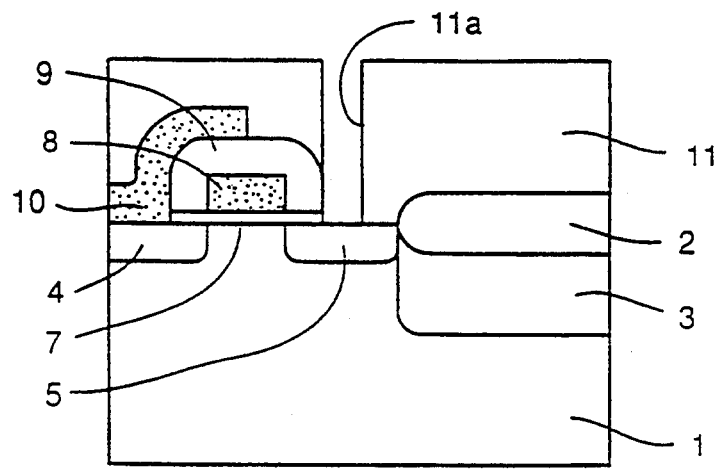

Then, as shown in FIG. 49, interlayer insulating film 11 is formed on the whole surface. The upper surface of interlayer insulating film 11 is planarized by the reflow method or etch-back method. Contact hole 11a is formed in interlayer insulating film 11 located above source/drain region 5, using photolithography.

Figure 50:
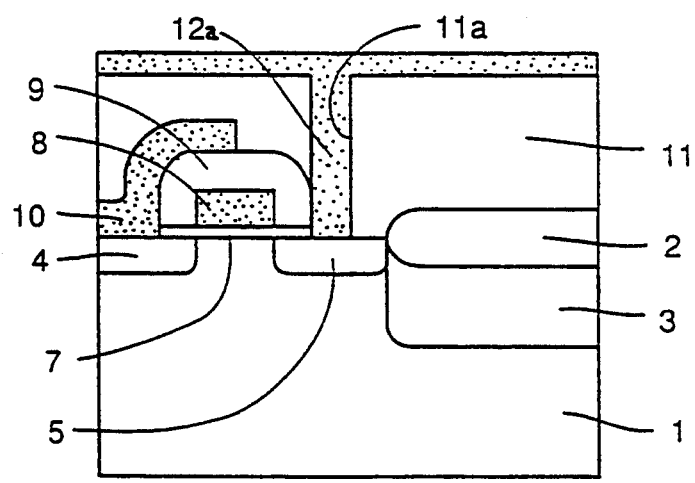

Then, as shown in FIG. 50, polysilicon layer 12a is formed in contact hole 11a and on the upper surface of interlayer insulating film 11 to be electrically connected to source/drain region 5, using the CVD method.

Figure 51:
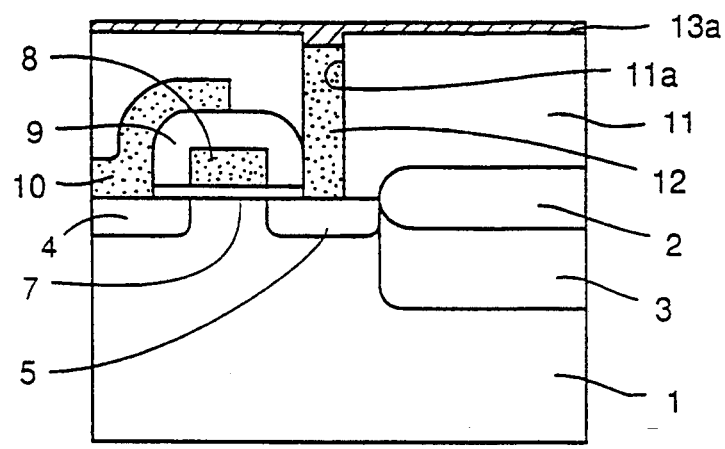

Then, as shown in FIG. 51, polysilicon layer 12a which is positioned on interlayer insulating film 11 and at the upper portion of contact hole 11a is removed by etching it back. Then a titanium nitride layer 13a having a thickness of 30–70 nm is formed, using the CVD method, such that it extends above interlayer insulating film 11 and interconnection layer 12, and is electrically connected to interconnection layer 12.

Figure 52:
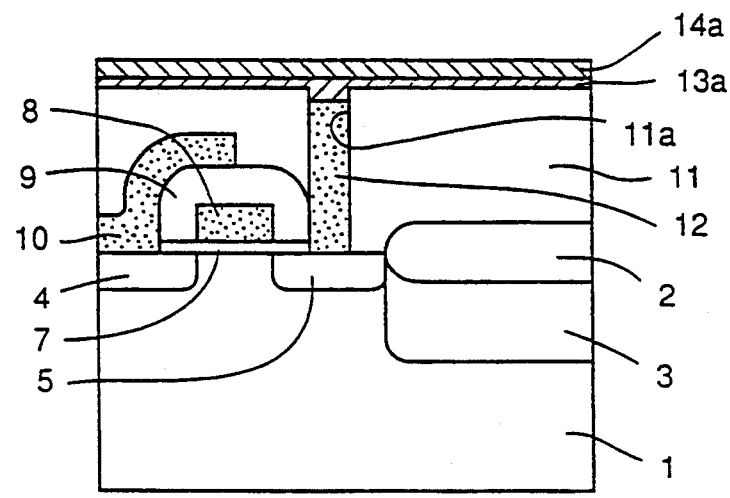

Then, as shown in FIG. 52, a platinum layer 14a having a thickness of 50–100 nm is formed on titanium nitride layer 13a, using the sputtering method. Layer 14a may be formed of high melting point noble metal such as palladium or gold, other than platinum.

Figure 53:
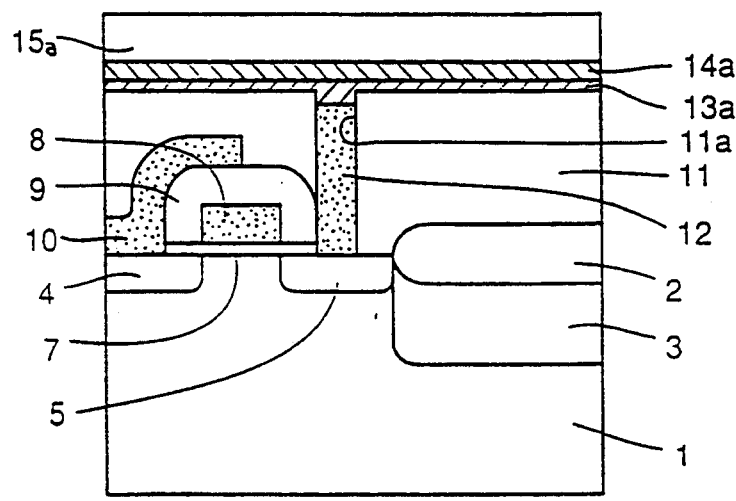

Then, as shown in FIG. 53, the sol/gel method, sputtering method or CVD method is applied to form a zirconium lead titanate ceramic (PZT) layer 15a, which has a thickness of 50–200 nm and forms the capacitor insulating film on platinum layer 14a. Layer 15a may be formed of PLZT instead of PZT.

Figure 54:
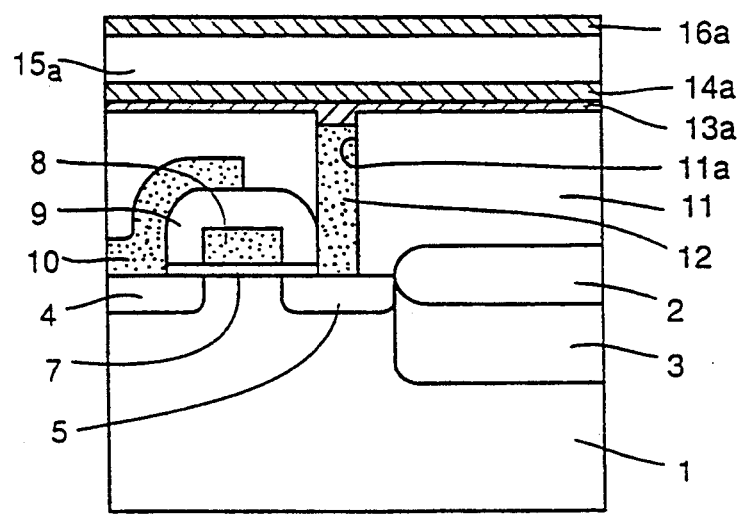

Then, as shown in FIG. 54, a capacitor upper electrode layer 16a formed of, e.g., platinum, titanium nitride, tungsten or aluminum is formed on PZT layer 15a.

Figure 55:
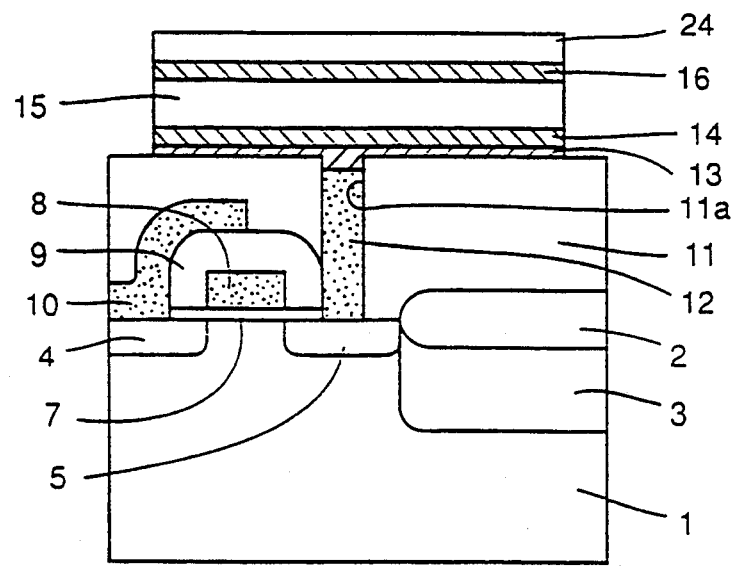

Then, as shown in FIG. 55, a resist 24 is formed on a predetermined region of capacitor electrode layer 16a (see FIG. 54), using photolithography. Resist 24 is used as a mask for anisotropic etching, by which titanium nitride layer 13, platinum layer 14, PZT film 15 and capacitor upper electrode 16 are formed. Thereafter, resist 24 is removed.

Figure 56:
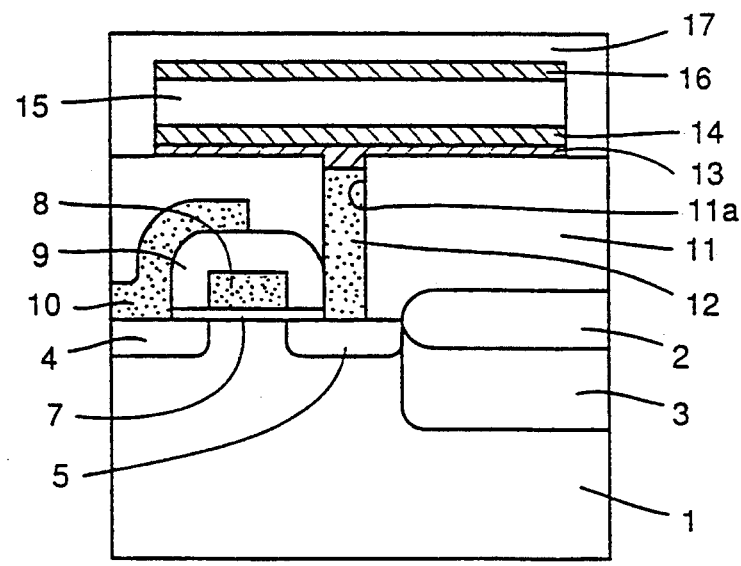

Then, as shown in FIG. 56, interlayer insulating film 17 is formed on the whole surface.

Figure 57:
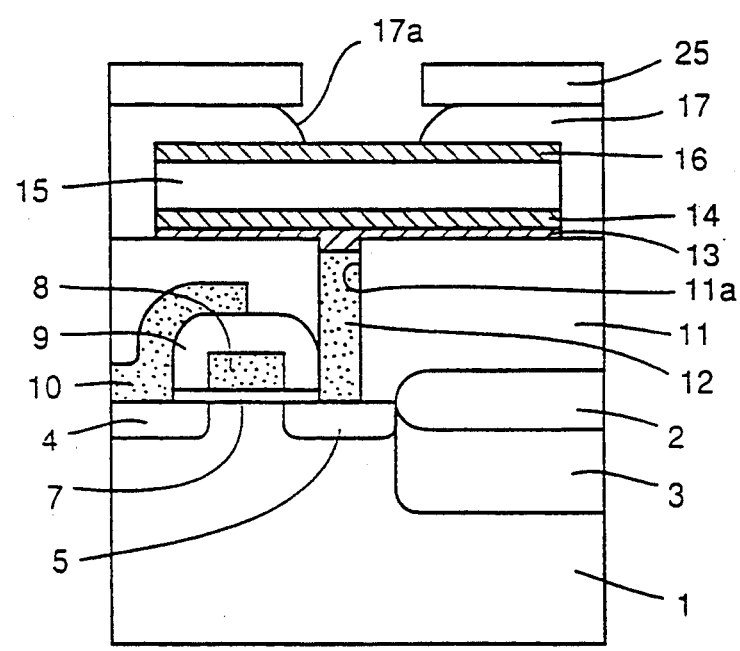

Then, as shown in FIG. 57, a resist 25 is formed in predetermined region on interlayer insulating film 17, using photolithography. Resist 25 is used as a mask for isotropic etching to form contact hole 17a. Thereby, a portion of a surface region of capacitor upper electrode 16 is exposed. Thereafter, resist 25 is removed.

Finally, interconnection layer 18 is formed, as shown in FIG. 35, such that it is electrically connected through contact hole 17a to capacitor upper electrode 16 and extends on and along interlayer insulating film 17. Interconnection layer 18 is formed of aluminum, tungsten, tungsten silicide, copper or the like. Interconnection layer 18 is patterned, using the photolithography and etching technique. In this fifth embodiment, interconnection layer 18 is directly connected to capacitor upper electrode 16. The embodiment is not restricted to this, and a barrier metal layer may be formed between interconnection layer 18 and capacitor upper electrode 16. The DRAM of the fifth embodiment is facilely formed as described hereinabove.

Figure 58:
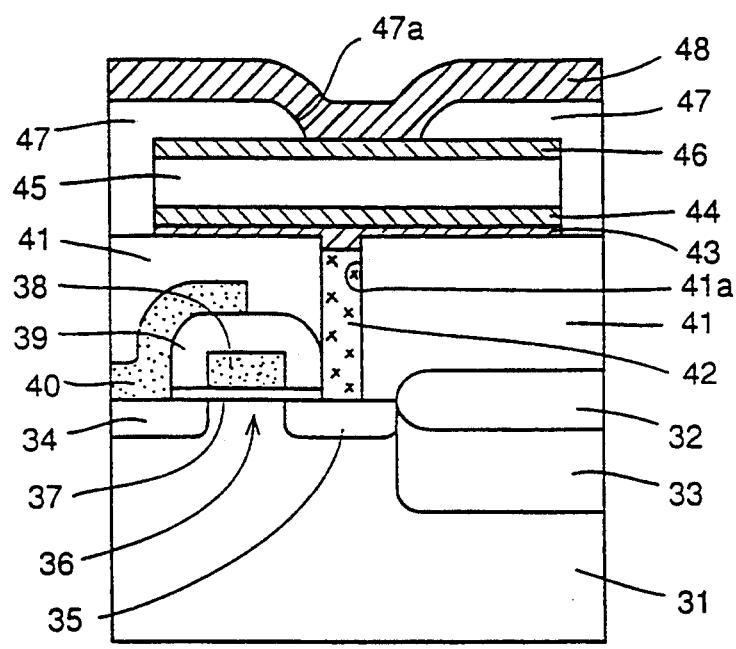
FIG. 58 is a cross section of a DRAM provided with a stacked type capacitor according to a sixth embodiment of the invention.

Referring to FIG. 58, the DRAM of a sixth embodiment includes a silicon semiconductor substrate 21 as well as following components and portions. An isolating oxide film 32 for elements is formed in a predetermined region of a major surface of silicon semiconductor substrate 21. A channel stopper layer 33 is formed under oxide film 32. A pair of source/drain regions 34 and 35 are formed in an active region surrounded by oxide film 32, and are located at opposite sides of a channel region 36 with a predetermined space therebetween. A gate electrode 38 is formed on channel region 36 with a gate insulating film 37 therebetween. Gate electrode 38 is covered with an insulating film 39. A buried bit line 40 is electrically connected to source/drain region 34 and extends on and along insulating film 39. An interlayer insulating film 41 covering the whole surface has a contact hole 41a located above source/drain region 35. A tungsten plug 42 is formed in contact hole 41a and is electrically connected to source/drain region 35. A titanium nitride layer 43 extends on and along interlayer insulating film 41 and tungsten plug 42 and is electrically connected to tungsten plug 42. A platinum layer 44 is formed on titanium nitride layer 43. A ferroelectric film 45 of PZT or PZLT is formed on platinum layer 44. A capacitor upper electrode 46 of platinum, titanium nitride, tungsten or aluminum is formed on ferroelectric film 45. An interlayer insulating film 47 covering the whole surface has a contact hole 47a in a predetermined portion of a surface of capacitor upper electrode 46. An interconnection layer 48 formed of aluminum, tungsten, tungsten silicide or copper is electrically connected through contact hole 47a to capacitor upper electrode 46 and extends on and along a surface of layer insulating film 47.

In the sixth embodiment, tungsten plug 42 is used as interconnection layer for electrically connecting titanium nitride layer 43 and source/drain region 35. Layer 44 may be formed of high melting point noble metal such as gold or palladium, other than platinum.

The manufacturing process for tungsten plug 42 is carried out by etching back the tungsten layer, which has been formed by the conventional CVD method, to leave the tungsten layer only in contact hole 41a. In another manufacturing process for tungsten plug 42, the tungsten layer is formed selectively on a portion of silicon semiconductor substrate 31 exposed in contact hole 41a, using CVD method. Thus, the tungsten layer is grown with priority on the silicon crystal to form tungsten plug 42. Titanium nitride layer 43 is formed to have the film thickness of 30–70 nm by CVD method. Platinum layer 44 is formed to have the film thickness of 50–100 nm by sputtering method. Ferroelectric film 45 is formed to have the film thickness of 50–200 nm by sol/gel method, sputtering method or CVD method. Titanium nitride layer 43 has the adhesion to interlayer insulating film 41 and has a characteristic as a barrier layer between tungsten plug 42 and platinum layer 44. These adhesion and characteristic will not be deteriorated by heat treatment at a high temperature of about 600°–700° C. in a later step.

Figure 59:
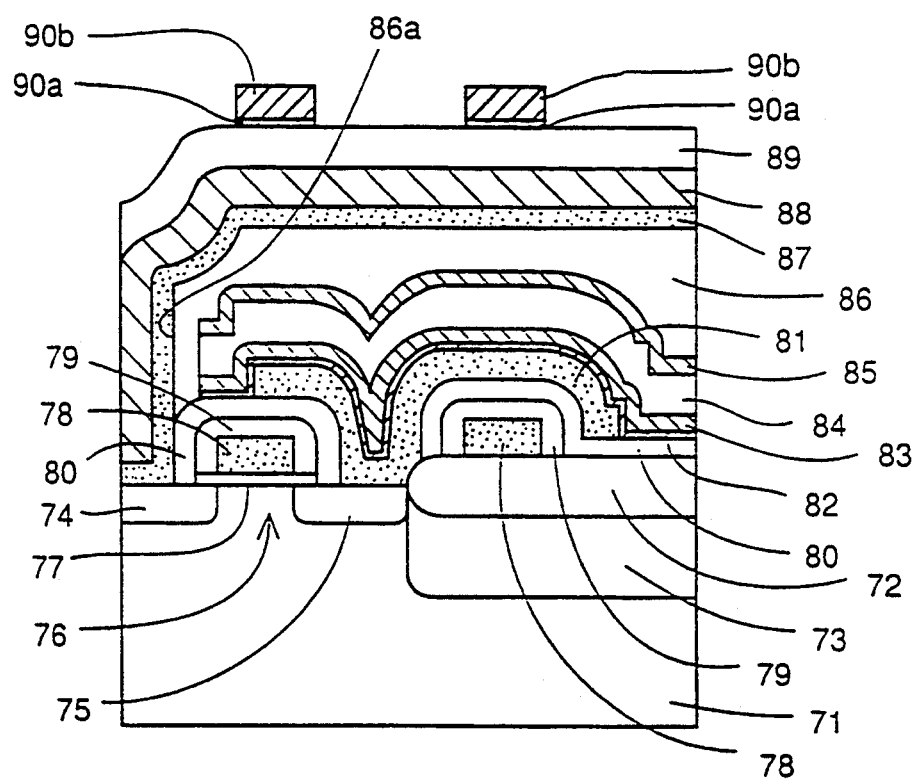
FIG. 59 is a cross section of a DRAM provided with a stacked type capacitor in accordance with a seventh embodiment of the invention.

Referring to FIG. 59, a DRAM of a seventh embodiment includes a silicon semiconductor substrate 71 as well as following components and portions. An isolating oxide film 72 for isolating elements are formed on a predetermined region of a major surface of silicon semiconductor substrate 71. A channel stopper layer 73 is formed under isolating oxide film 72. Source/drain regions 74 and 75 are formed in an active region surrounded by isolating oxide film 72 and are located at opposite sides of a channel region 76 with a predetermined space therebetween. A gate electrode 78 is formed on channel region 76 with a gate insulating film 77 therebetween. Gate electrode 78 is covered with an oxide film 79. Oxide film 79 is covered with an oxide film 80. A polysilicon layer 81 is electrically connected to source/drain region 75 and extends on and along the surface of oxide film 80. Polysilicon layer 81 is covered with a titanium nitride layer 82. A high melting point noble metal layer 83 of, e.g., platinum is formed on titanium nitride layer 82. A ferroelectric film 84 of zirconium lead titanate ceramic (PZT) film or PLZT film is formed on high melting point noble metal layer 83. A capacitor upper electrode 85 of, e.g., platinum, titanium nitride, tungsten or aluminum is formed on ferroelectric film 84. An interlayer insulating film 86 covers the whole surface and has a contact hole 86a located above source/drain region 74. A polysilicon layer 87 is electrically connected through contact hole 86a to source/drain region 74 and extends on and along the surface of interlayer insulating film 86. A tungsten silicide film 88 having a predetermined thickness is formed on the surface of polysilicon layer 87. An interlayer insulating film 89 is formed on tungsten silicide film 88. A titanium layer 90a is formed on a predetermined region of interlayer insulating film 89 to correspond to gate electrode 78. An aluminum alloy layer 90b is formed on titanium layer 90a. Gate electrode 78 and a pair of source/drain regions 74 and 75 form a transfer gate transistor of the memory cell. Polysilicon layer 87 and tungsten silicide layer 88 form a bit line. Titanium nitride layer 82 is formed to have the film thickness of 30–70 nm, using sputtering method or CVD method. If high melting point noble metal layer 83 is formed of the platinum layer, the sputtering method is used to form the platinum layer having the film thickness of 50–100 nm. Ferroelectric film 84 is formed to have the film thickness of 50–200 nm, using sol/gel method, sputtering method or CVD method. Also in the DRAM of this seventh embodiment, titanium nitride layer 82 is interposed between the high melting point noble metal layer 83 and polysilicon layer 81, which prevents the silicification reaction of polysilicon layer 81 and high melting point noble metal layer 83 (platinum layer).

Figure 60:
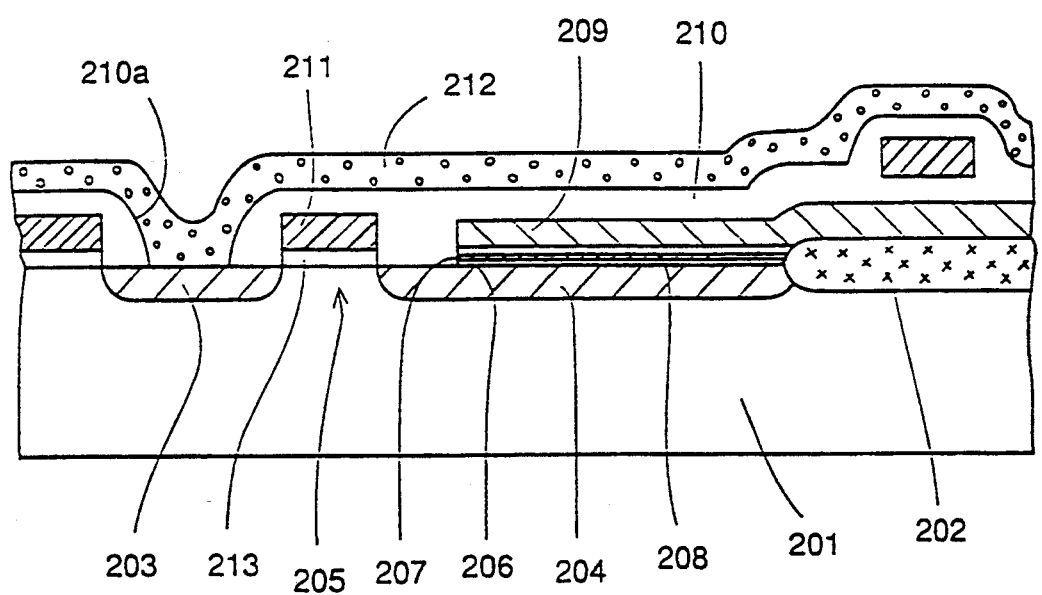
FIG. 60 is a cross section of a DRAM provided with a capacitor of a planar type in accordance with an eighth embodiment of the invention.
Figure 61:
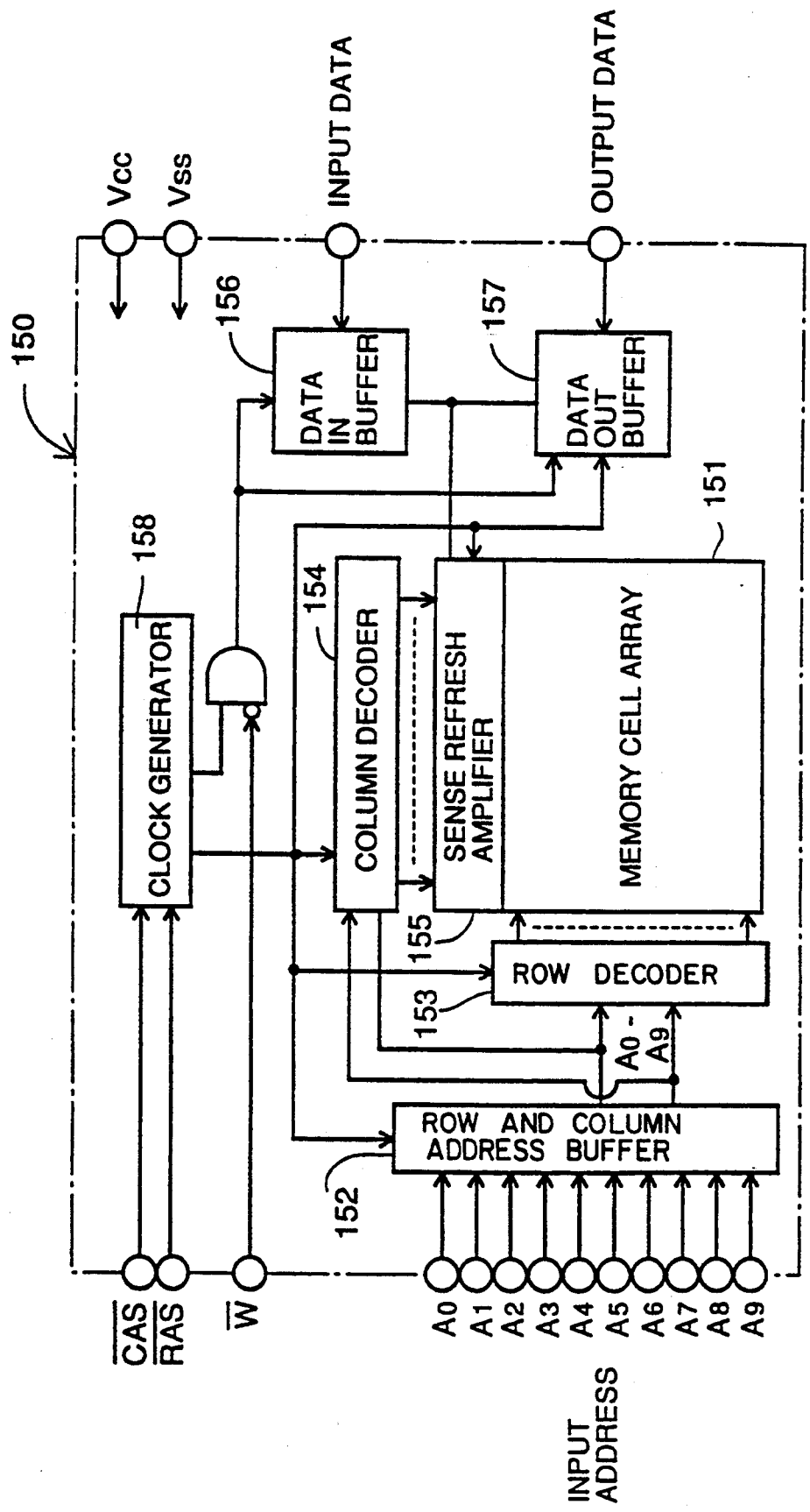
FIG. 61 is a block diagram showing a construction of a conventional DRAM.
Figure 62:
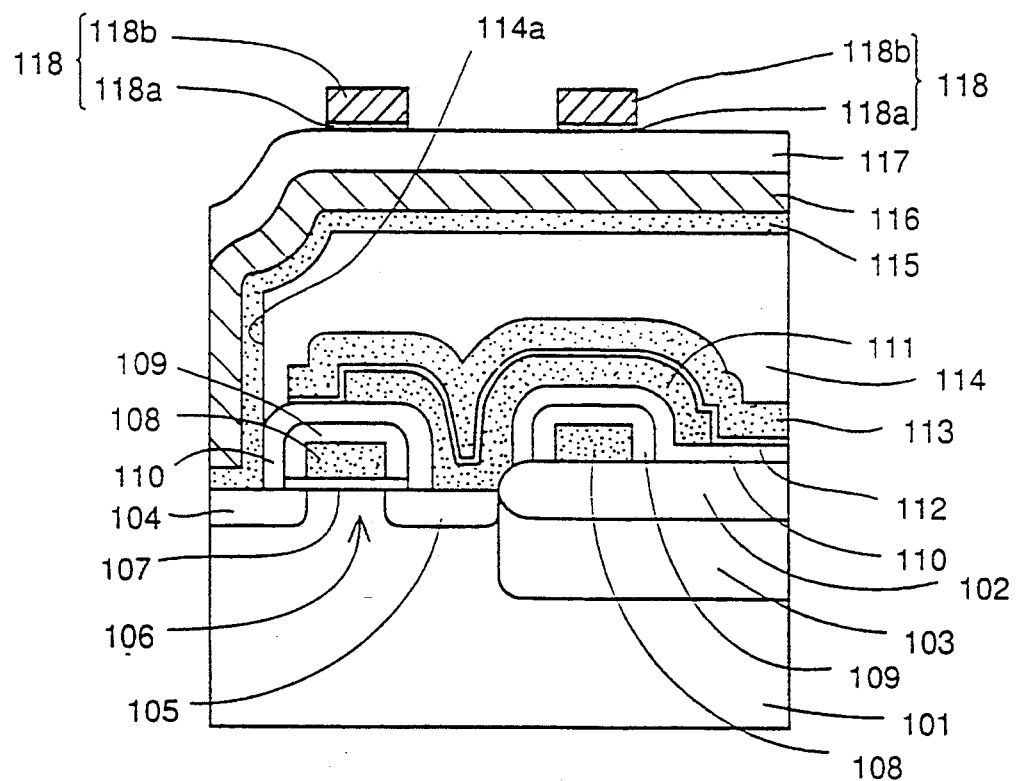
FIG. 62 is a cross section of a DRAM provided with a stacked type capacitor in the prior art.
Figure 63:
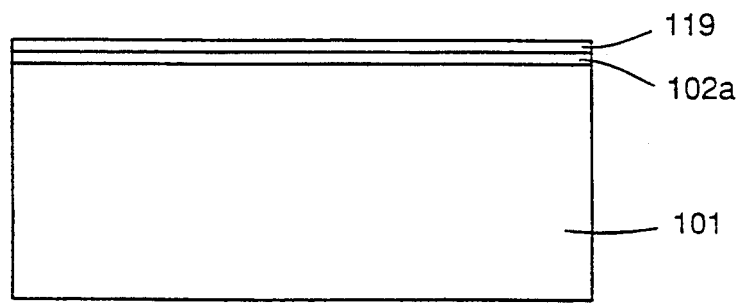
FIGS. 63 to 82 are cross sections showing the 1st to 20th steps in a manufacturing process of the conventional DRAM shown FIG. 62.
Figure 64:
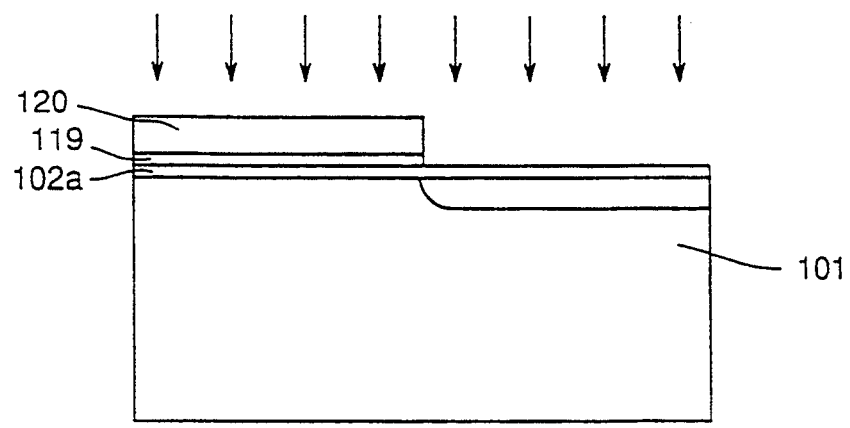
Figure 65:
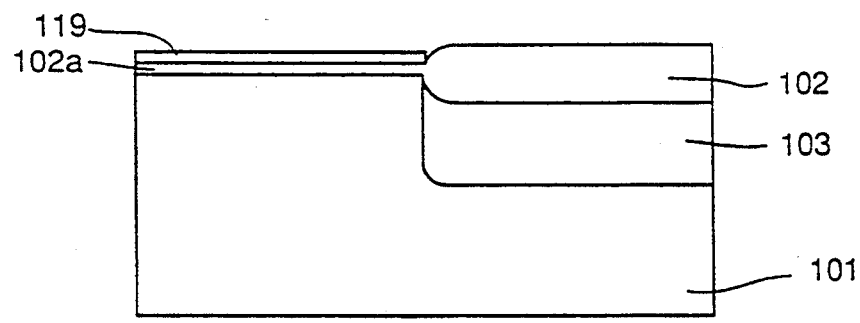
Figure 66:
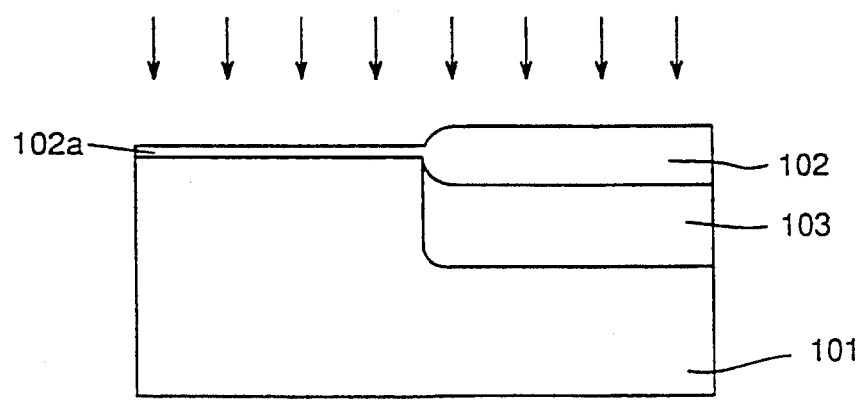
Figure 67:
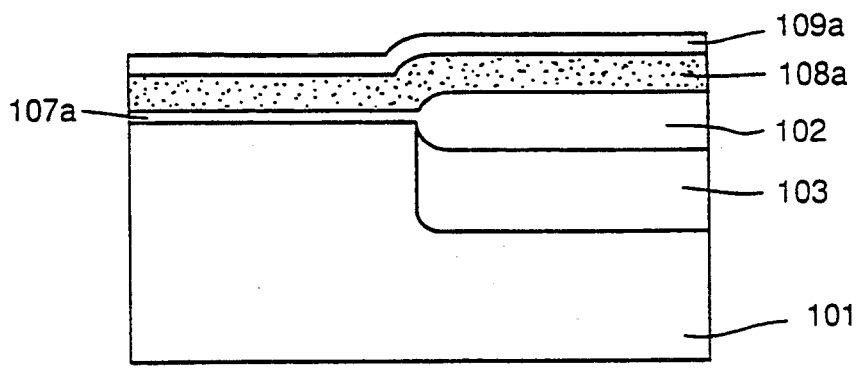
Figure 68:
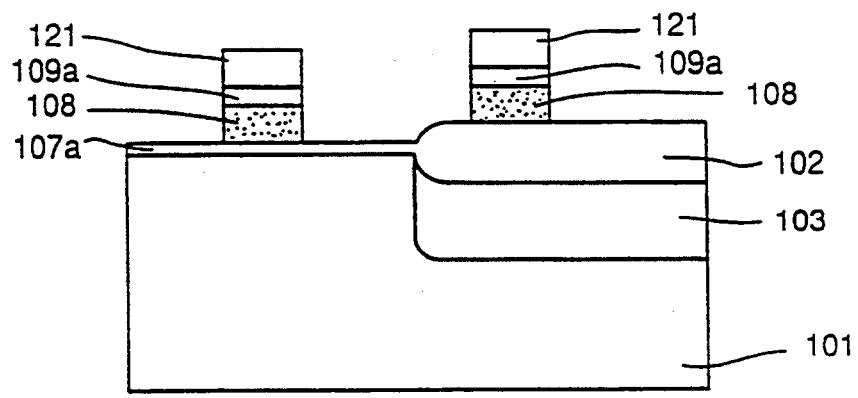
Figure 69:
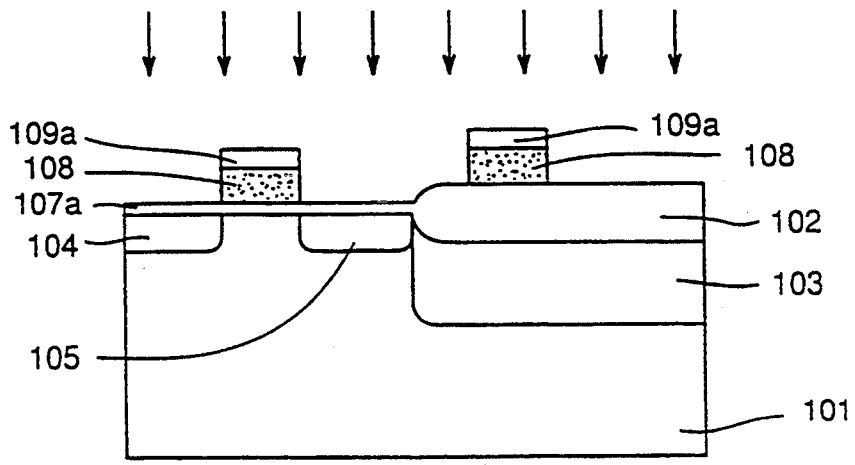
Figure 70:
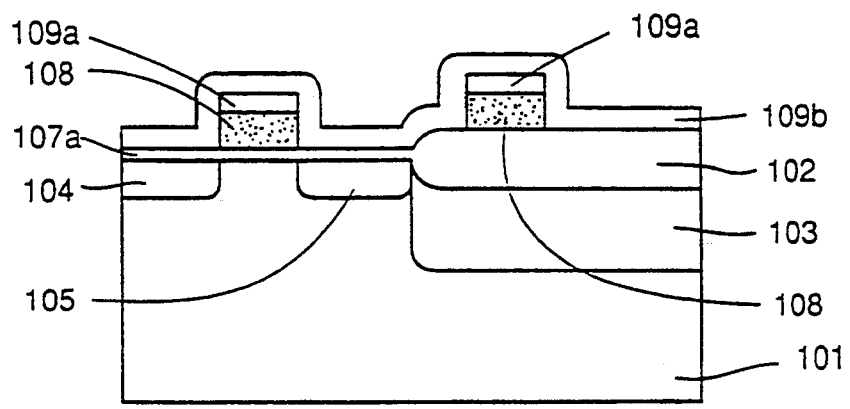
Figure 71:
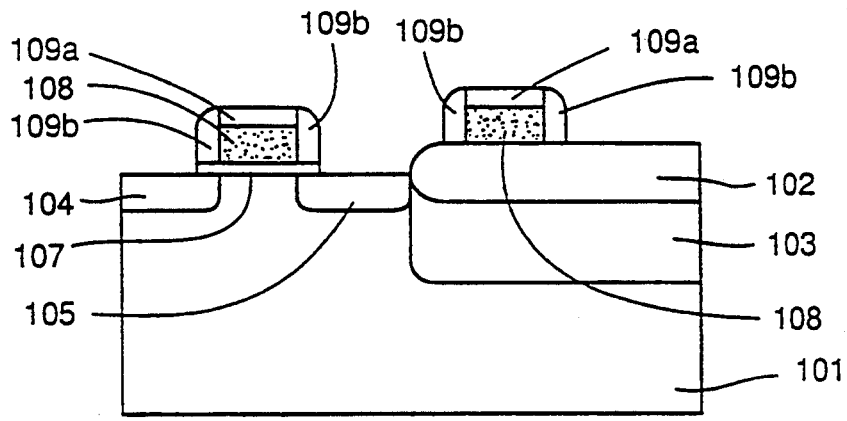
Figure 72:
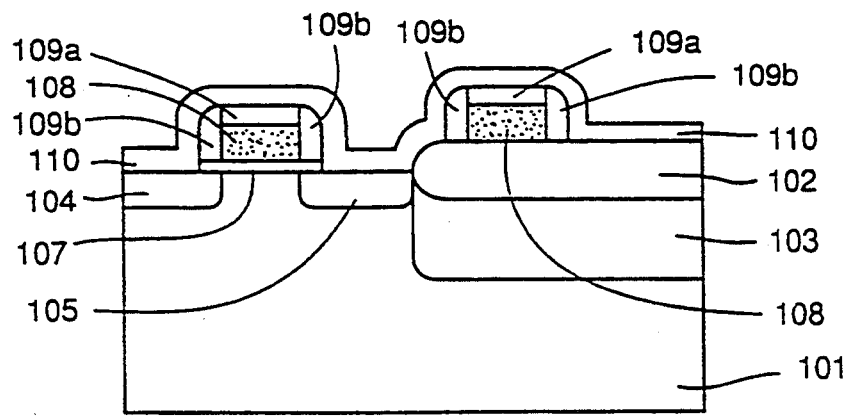
Figure 73:
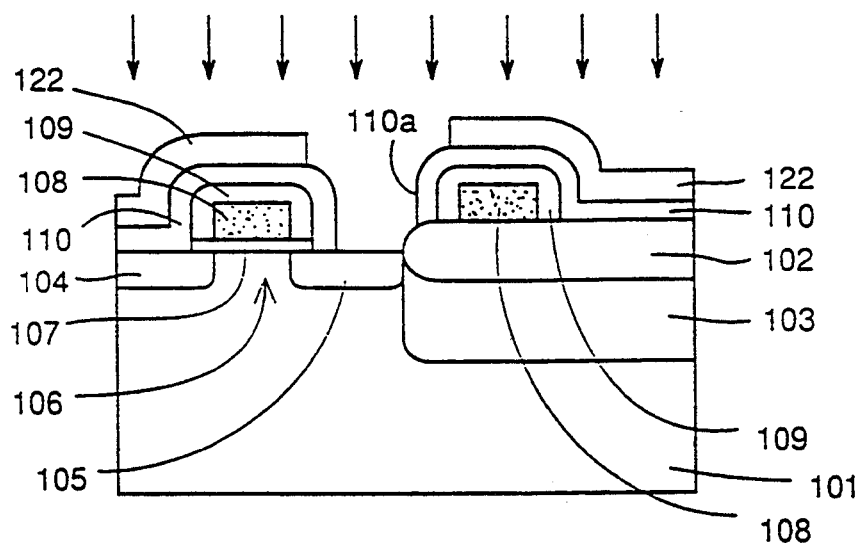
Figure 74:
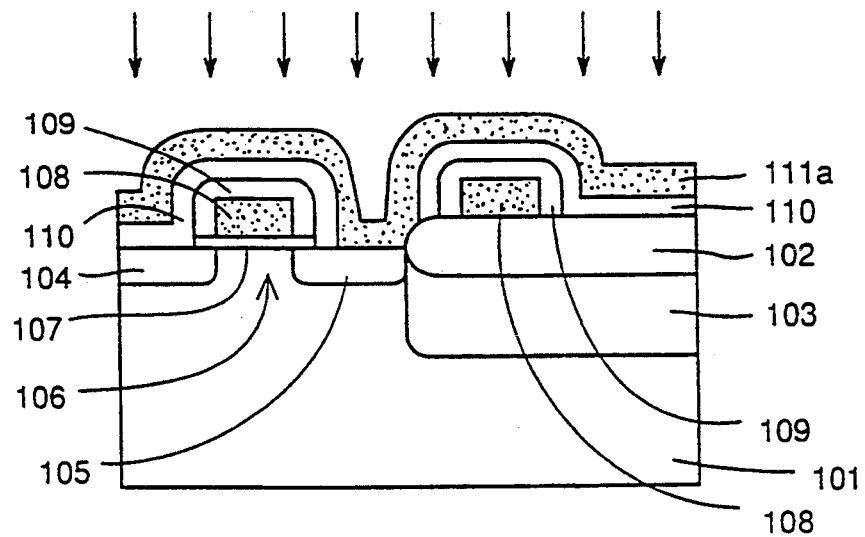
Figure 75:
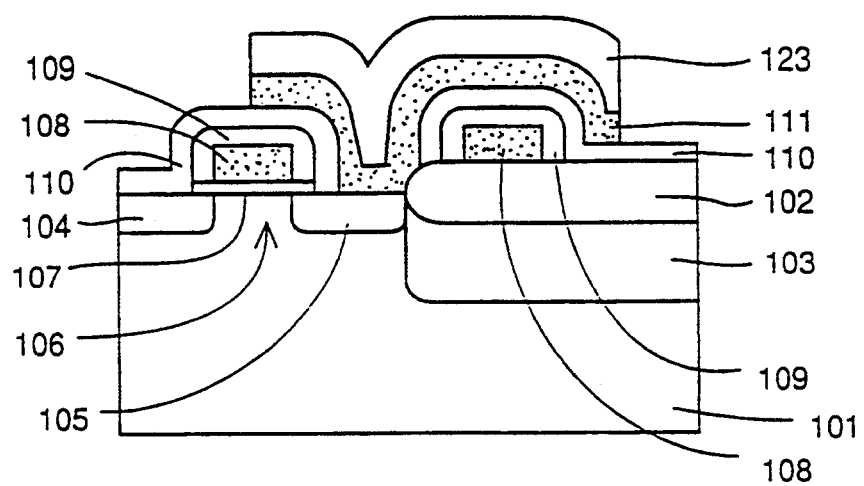
Figure 76:
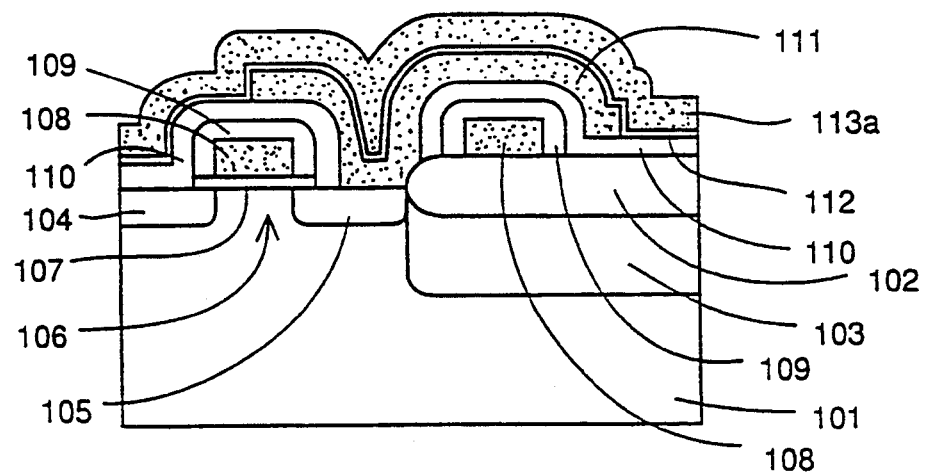
Figure 77:
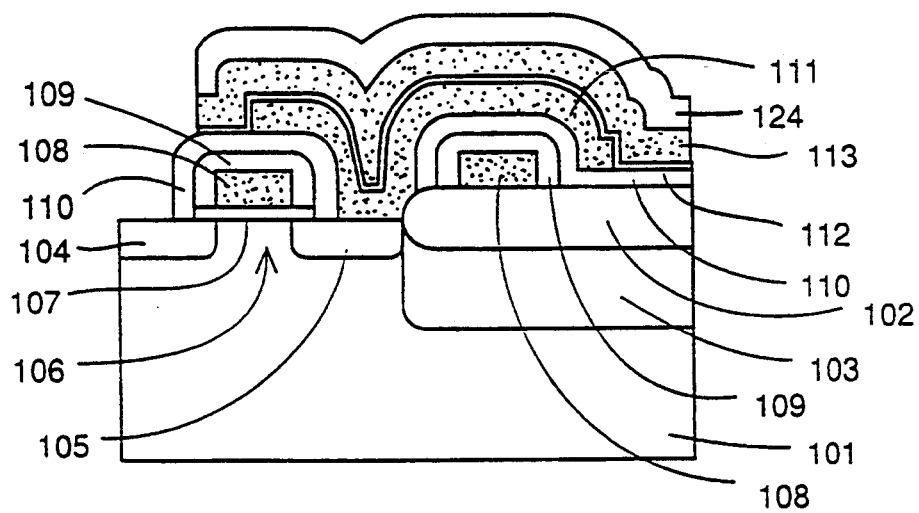
Figure 78:
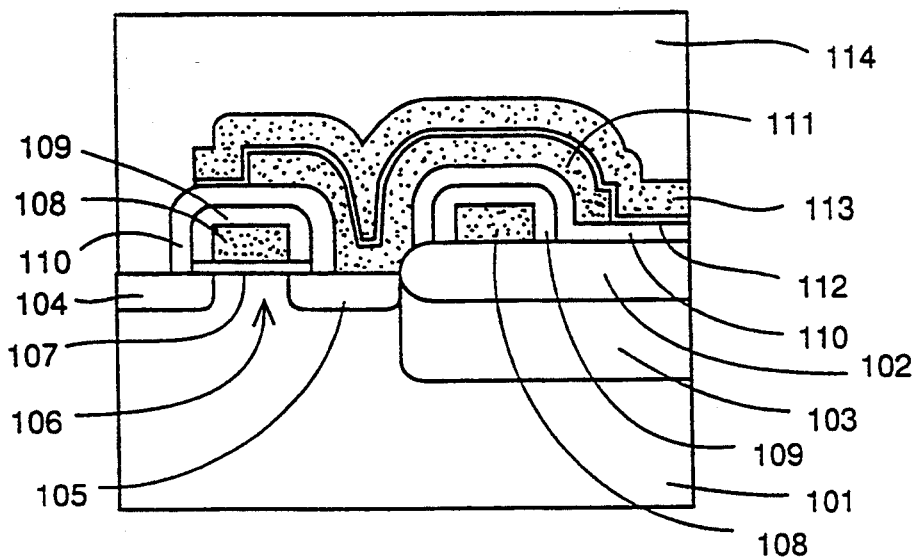
Figure 79:
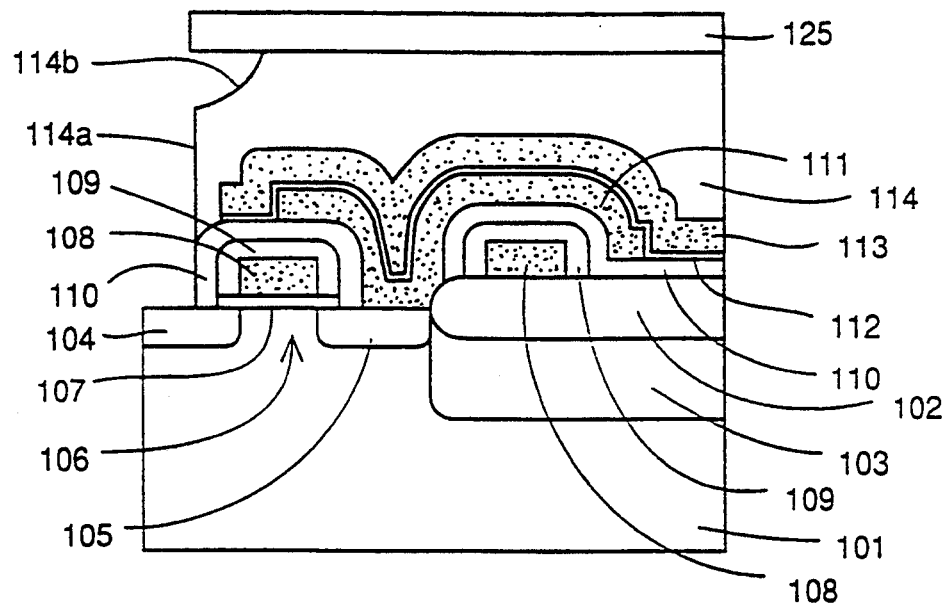
Figure 80:
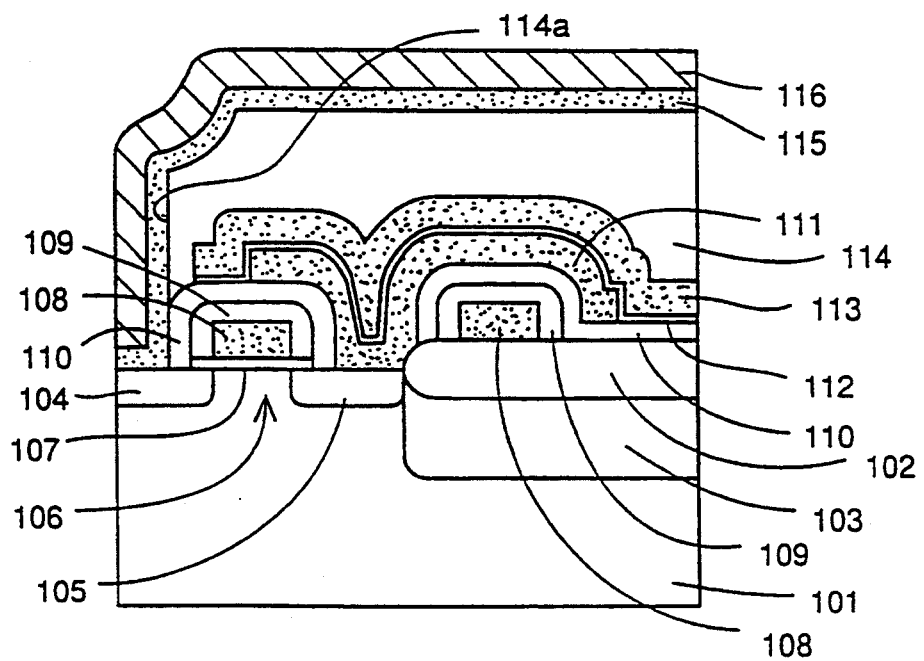
Figure 81:
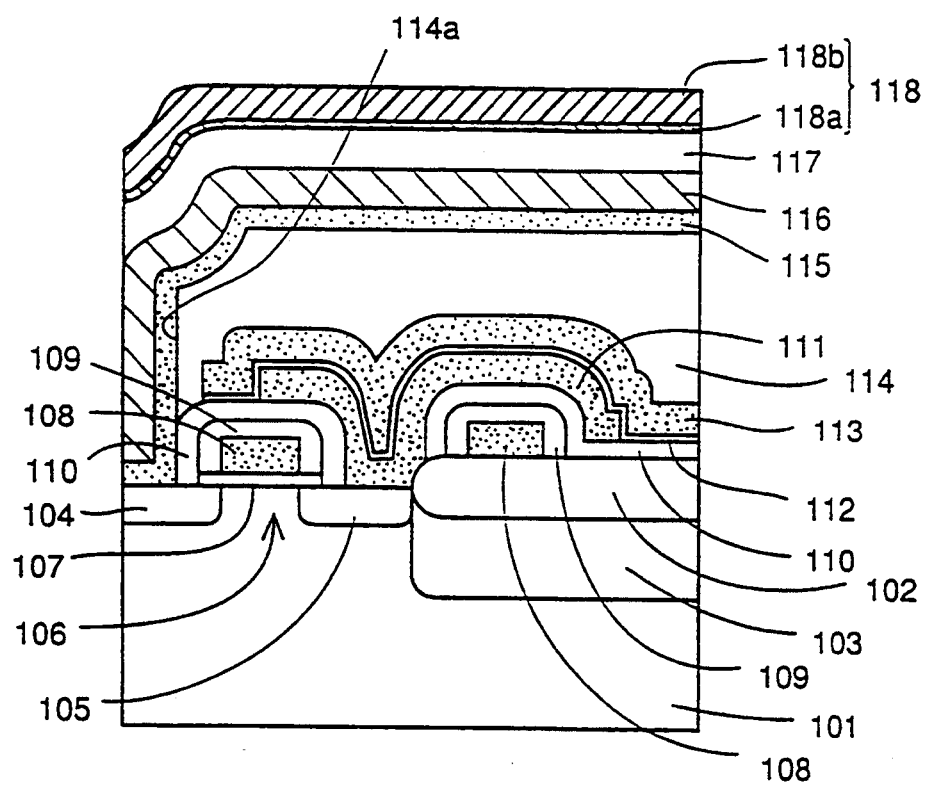
Figure 82:
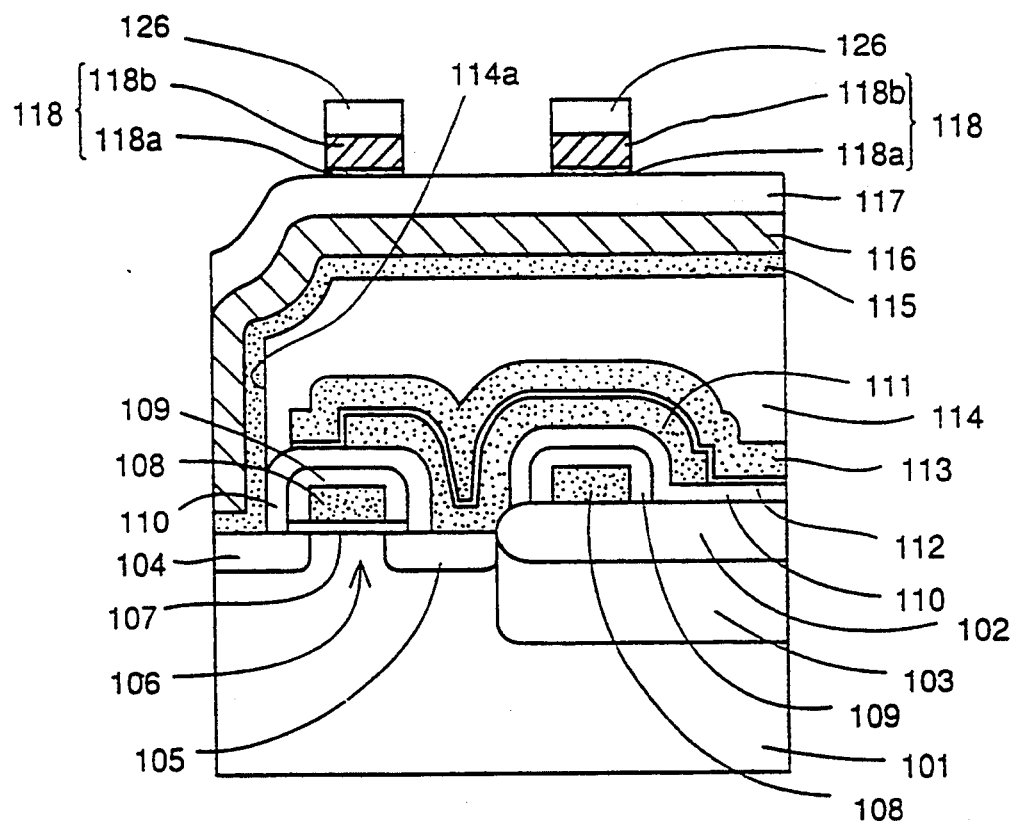

Referring to FIG. 60, a DRAM of an eighth embodiment includes a silicon semiconductor substrate 201 as well as following components and portions. An isolating oxide film 202 for elements is formed on a predetermined region of the major surface of silicon semiconductor substrate 201. A pair of source/drain regions 203 and 204 are formed in an active region surrounded by an oxide film 202 and is located at the opposite sides of a channel region 205 with a predetermined space therebetween. A gate electrode 211 is formed on channel region 205 with a gate insulating film 213 therebetween. A titanium nitride layer 206 having a thickness of 30-70 nm is formed on source/drain region 204. A platinum layer 207 having a thickness of 50-100 nm is formed on titanium nitride layer 206. A ferroelectric film 208 having a thickness of 50-200 nm is formed on platinum layer 207. A capacitor upper electrode 209 of, e.g., platinum, titanium nitride, tungsten or aluminum is formed on ferroelectric film 208. An interlayer insulating film 210 covering the whole surface has a contact hole 210a located on source/drain region 203. A bit line 212 is electrically connected through contact hole 210a to source/drain region 203 and extends on and along the surface of interlayer insulating film 210. In this eighth embodiment, a capacitor of a planar type is formed by source/drain region 204, titanium nitride layer 206, high melting point noble metal layer 207, ferroelectric film 208 and capacitor upper electrode 209. Thus, ferroelectric film 208 is used as the capacitor insulating film in the capacitor of the conventional planar type, whereby the dielectric constant of the capacitor insulating film itself may be improved, and thus the capacitor capacity can be increased with the same planar area as the prior art. If ferroelectric film 208 is used as described above, high melting point noble metal layer 207 formed of, e.g., the platinum layer is required for maintaining the characteristics of ferroelectric film 208. However, high melting point noble metal layer 207 may unpreferably cause the silicification reaction with silicon semiconductor substrate 201. For this reason, this eighth embodiment employs titanium nitride layer 206 interposed between high melting point noble metal layer 207 and silicon semiconductor substrate 201. Owing to this structure, titanium nitride layer 206 serves as a barrier layer, and thus effectively prevents the silicification reaction of high melting point noble metal layer 207 and silicon semiconductor substrate 201. Consequently, SiO2 film having a low dielectric constant, which may be formed by the silicification reaction of high melting point noble metal layer 207 and silicon semiconductor substrate 201, is not formed on the surface of high melting point noble metal layer 207, and thus the characteristic of ferroelectric film 208 can be maintained. Therefore, the capacitor capacity can be increased with the same planar area as the prior art.

In a semiconductor device according to the invention, a plug electrode layer in contact with a semiconductor substrate in an aperture portion of an insulating layer is formed extending on and along the upper surface of the insulating layer; and a capacitor lower electrode of a high melting point noble metal layer is formed on the plug electrode layer, whereby a stepped portion is not created on the capacitor lower electrode unlike in the prior art, and thus a disadvantage does not occur that the thickness of a PZT layer to be formed on the capacitor lower electrode is made thin at the stepped portion. Therefore, the space between a capacitor upper electrode to be formed on the PZT layer and the capacitor lower electrode is not made partially narrow, and a electric field between the capacitor upper electrode and the capacitor lower electrode is not made uneven. Consequently, pressure-resistant and leakage-resistant characteristics of a capacitor can be effectively prevented from being impaired. Also, the capacitor lower electrode of high melting point noble metal formed on the plug electrode layer can be effectively prevented from silicification unlike in the prior art, since the plug electrode layer is formed of at least one material selected from the group consisting of high melting point metals and high melting point metal nitrides. In addition, if the plug electrode layer is formed of a material having a good adhesion to an insulating layer of Ti or TiN, for example, adhesion of the plug electrode layer and the insulating layer is improved, and thus disadvantageous separation of the capacitor lower electrode can be effectively prevented.

According to another semiconductor device of the invention, a plug electrode is formed filling, in contact with a semiconductor substrate in an aperture portion of insulating layer, up to a predetermined height therein; an adhesive layer is formed electrically connected to the plug electrode in the aperture portion and extending on and along the upper surface of the insulating layer; and a capacitor lower electrode of a high melting point noble metal layer is formed on the adhesive layer, whereby creation of a stepped portion on the capacitor lower electrode can be effectively prevented unlike in the prior art. Therefore, the thickness of PZT layer to be formed on the capacitor lower electrode is prevented from being partially made thin, and the space between a capacitor upper electrode to be formed on PZT layer and the capacitor lower electrode is not made narrow. Consequently, a uniform electric field can be obtained between the capacitor lower electrode and the capacitor upper electrode, enhancing the pressure resistant and leakage-resistant characteristics of a capacitor. A silicification reaction of the capacitor lower electrode of high melting point noble metal layer, which may occur in the prior art, can also be effectively prevented. In addition, separation of the capacitor lower electrode on the adhesive layer can be effectively prevented because the adhesive layer is made of Ti or TiN having good adhesion to an insulating layer so as to improve adhesion of the adhesive layer and the insulating layer.

According to a further semiconductor device of the invention, as described hereinabove, the first capacitor lower electrode has the high melting point metal nitride layer at least at the surface portion, and the second capacitor lower electrode formed of high melting point noble metal layer is formed on the surface of the first capacitor lower electrode. The zirconium lead titanate ceramic (PZT) layer is formed on the second capacitor lower electrode. The capacitor upper electrode is formed on the zirconium lead titanate ceramic layer. Thereby, the high melting point metal nitride layer is located under the second capacitor lower electrode formed of the high melting point noble metal layer, so that silicification reaction, which may occur between the high melting point noble metal layer and the silicon layer formed under the same in the prior art, can be effectively prevented. Consequently, SiO2 film having the low dielectric constant, which may be formed due to the silicification reaction between the high melting point noble metal layer and the silicon layer, is not formed on the surface of the second capacitor lower electrode formed of the high melting point noble metal layer, and thus the performance of the zirconium lead titanate ceramic (PZT) layer used as the capacitor insulating film is not deteriorated. As a result, the performance of the zirconium lead titanate ceramic (PZT) layer as the capacitor insulating film can be maintained, and the sufficient capacitor capacity can be obtained. If the capacitor lower electrode is formed to extend on and along the interlayer insulating film, the high melting point metal nitride layer having the good adhesion to interlayer insulating film is formed on the surface of the interlayer insulating film, so that separation of the first capacitor lower electrode from the interlayer insulating film can be prevented. Consequently, the second capacitor lower electrode formed on the first capacitor lower electrode is not separated. Therefore, the stacked type capacitor having the mechanically stable structure can be obtained.

In a manufacturing method of a semiconductor device according to the invention, a plug electrode layer is formed, using the CVD method, filling an aperture portion of an insulating layer in contact with a semiconductor substrate in the aperture portion, and extending on and along the upper surface of the insulating layer; and a capacitor lower electrode is formed of a high melting point noble metal layer on the plug electrode layer, whereby creation of a stepped portion can be easily prevented unlike in the prior art. The plug electrode layer is formed of at least one material selected from the group consisting of high melting point metals and high melting point metal nitrides, and the capacitor lower electrode is formed on the plug electrode layer, whereby a silicification reaction of the capacitor lower electrode can be effectively prevented in a later heat treatment step.

In another manufacturing method of a semiconductor device according to the invention, a conductive layer is formed filling an aperture portion of an insulating layer in contact with a semiconductor substrate therein, and extending on and along the upper surface of the insulating layer; the conductive layer existing on the upper surface of the insulating layer is removed by etching back the conductive layer, as well as the conductive layer filled in the aperture portion is removed for a predetermined thickness, so that a plug electrode is formed; an adhesive layer is formed electrically connected to the plug electrode in the aperture portion and extending on and along the upper surface of the insulating layer; and a capacitor lower electrode of a high melting point noble metal layer is formed on the adhesive layer; whereby creation of a stepped portion on the capacitor lower electrode can be effectively prevented unlike in the prior art. Further, the adhesive layer is formed of one material selected from the group consisting of high melting point metals and high melting point metal nitrides, whereby a silicification reaction of the capacitor lower electrode can be effectively prevented in a later heat treatment step.

In a further manufacturing method of a semiconductor device according to the invention, the first capacitor lower electrode is formed to have the high melting point metal nitride layer at least at its surface portion. The second capacitor lower electrode formed of the high melting point noble metal layer is formed on the first capacitor lower electrode. The zirconium lead titanate ceramic layer is formed on the second capacitor lower electrode. The capacitor upper electrode is formed on the zirconium lead titanate ceramic layer. Thereby, the high melting point metal nitride layer is located under the second capacitor lower electrode formed of the high melting point noble metal layer, so that the second capacitor lower electrode formed of the high melting point noble metal layer will not cause the silicification reaction in the later heat treatment step with the base silicon layer, which may occur in the prior art.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate;
   an insulating layer formed on said semiconductor substrate, and having its upper surface planarized with an aperture portion reaching said semiconductor substrate on a predetermined region;
   a plug electrode layer formed as one body of at least one material selected from the group consisting of high melting point metals and high melting point metal nitrides, formed filling said aperture portion in contact with said semiconductor substrate in said aperture portion and extending on and along the upper surface of said insulating layer;
   a capacitor lower electrode of high melting point noble metal formed on said plug electrode layer;
   a ferroelectric layer formed on said capacitor lower electrode; and
   a capacitor upper electrode formed on said ferroelectric layer.

2. The semiconductor device according to claim 1, wherein
   said plug electrode layer is formed at least one material selected from the group consisting of Ti, W, TiN, and WN.

3. The semiconductor device according to claim 1, wherein
   a film thickness of a portion of said plug electrode layer located on said insulating layer is approximately 10–50 nm,
   a thickness of said capacitor lower electrode is approximately 50–100 nm, and
   a thickness of said ferroelectric layer is approximately 50–200 nm.

4. The semiconductor device according to claim 1, wherein
   said plug electrode layer comprises
   a first plug electrode layer of W, formed buried into said aperture portion and extending on and along the upper surface of said insulating layer, and
   a second plug electrode layer of WN, formed on said first plug electrode layer.

5. A semiconductor device, comprising:
   a semiconductor substrate;
   an insulating layer formed on said semiconductor substrate, and having its upper surface planarized with an aperture portion reaching said semiconductor substrate on a predetermined region;
   a plug electrode formed filling in contact with said semiconductor substrate in said aperture portion and up to a predetermined height in said aperture portion;
   an adhesive layer of one material selected from the group consisting of high melting point metals and high melting point metal nitrides, formed electrically connected to said plug electrode in said aperture portion and extending on and along the upper surface of said insulating layer;
   a capacitor lower electrode of a high melting point noble metal layer formed on said adhesive layer;

a ferroelectric layer formed on said capacitor lower electrode; and a capacitor upper electrode formed on said ferroelectric layer.

6. The semiconductor device according to claim 5, wherein said plug electrode is formed of at least one material selected from the group consisting of polysilicon, W, and WN, and said adhesive layer is formed of one material selected from the group consisting of Ti and TiN.

7. The semiconductor device according to claim 5, wherein said plug electrode comprises a first plug electrode of W electrically connected to said semiconductor substrate in said aperture portion, and a second plug electrode of a WN layer, formed on the upper surface of said first plug electrode and having a thickness of approximately 5–30 nm.

8. The semiconductor device according to claim 5, wherein a thickness of said adhesive layer is approximately 30–70 nm, a thickness of said capacitor lower electrode is approximately 50–100 nm; and a thickness of said ferroelectric layer is approximately 50–200 nm.

* * * * *